United States Patent
Lin et al.

(10) Patent No.: US 8,248,656 B2
(45) Date of Patent: Aug. 21, 2012

(54) PATTERN PRINTING SYSTEM AND DATA PROCESSING METHOD THEREOF

(75) Inventors: Chih-Jian Lin, Banciao (TW);
Chia-Ming Chang, Sindian (TW);
Gian-Hung Liu, Banciao (TW);
Chih-Hsuan Chiu, Sindian (TW);
Yung-Kuo Ho, Pingtung (TW);
Hung-Pin Shih, Toufen Township, Miaoli County (TW); Chieh-Yi Huang, Cyonglin Township, Hsinchu County (TW); Chao-Kai Cheng, Chubei (TW)

(73) Assignee: Industrial Technology Research Institute, Hsinchu (TW)

( * ) Notice: Subject to any disclaimer, the term of this patent is extended or adjusted under 35 U.S.C. 154(b) by 1232 days.

(21) Appl. No.: 11/455,260

(22) Filed: Jun. 16, 2006

(65) Prior Publication Data

US 2007/0153302 A1 Jul. 5, 2007

(30) Foreign Application Priority Data

Dec. 30, 2005 (TW) .............................. 94147501 A

(51) Int. Cl.
*G06K 15/22* (2006.01)
*G06K 15/00* (2006.01)
*G06F 3/12* (2006.01)
*G06F 2/12* (2006.01)
*G01D 9/28* (2006.01)

(52) U.S. Cl. ...... 358/1.4; 358/1.15; 358/1.14; 358/1.13; 358/1.1; 346/46

(58) Field of Classification Search ........................ None
See application file for complete search history.

(56) References Cited

U.S. PATENT DOCUMENTS

| | | | |
|---|---|---|---|
| 4,631,100 A * | 12/1986 | Pellegrino | 156/150 |
| 5,387,976 A * | 2/1995 | Lesniak | 356/627 |
| 5,923,820 A * | 7/1999 | Cunnagin et al. | 358/1.8 |
| 6,005,681 A * | 12/1999 | Pollard | 358/473 |
| 6,450,608 B2 * | 9/2002 | Sarmast et al. | 347/19 |
| 6,754,551 B1 * | 6/2004 | Zohar et al. | 700/121 |
| 6,972,261 B2 * | 12/2005 | Wong et al. | 438/706 |
| 7,058,474 B2 * | 6/2006 | Ganot et al. | 700/192 |
| 7,270,712 B2 * | 9/2007 | Edwards et al. | 118/669 |

FOREIGN PATENT DOCUMENTS

| | | |
|---|---|---|
| WO | WO 02098576 | 12/2002 |
| WO | WO 02099848 | 12/2002 |
| WO | WO 2004050260 | 6/2004 |

* cited by examiner

*Primary Examiner* — Twyler Haskins
*Assistant Examiner* — Marcus T Riley
(74) *Attorney, Agent, or Firm* — J.C. Patents

(57) ABSTRACT

A pattern printing system and data processing method thereof are disclosed, which are suitable for printing patterns on printed circuit boards or data format rearrangement printing used in displays. The pattern printing method includes a process for interpreting scription data into matrix data, a procedure for modulating the print head resolution and the printing resolution, a procedure for interpreting and transmitting data commands, a procedure for rearranging memory data, and a procedure for firing data synchronously so as to achieve high-resolution printing and to continuously modulate any print data.

37 Claims, 24 Drawing Sheets

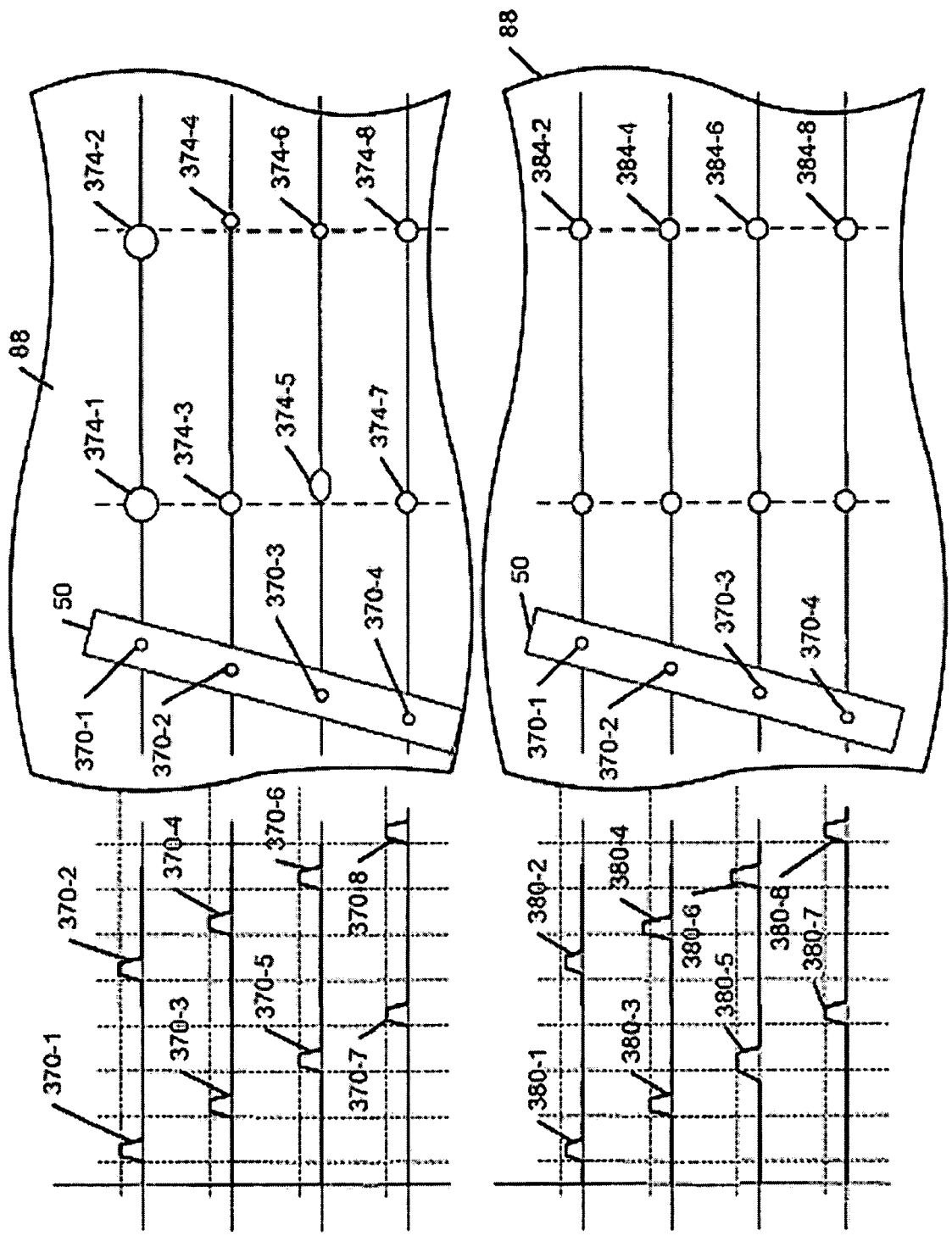

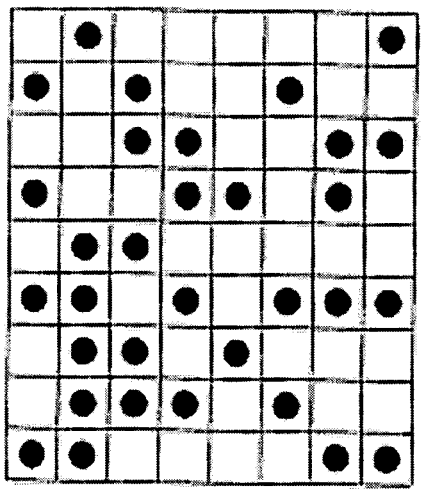
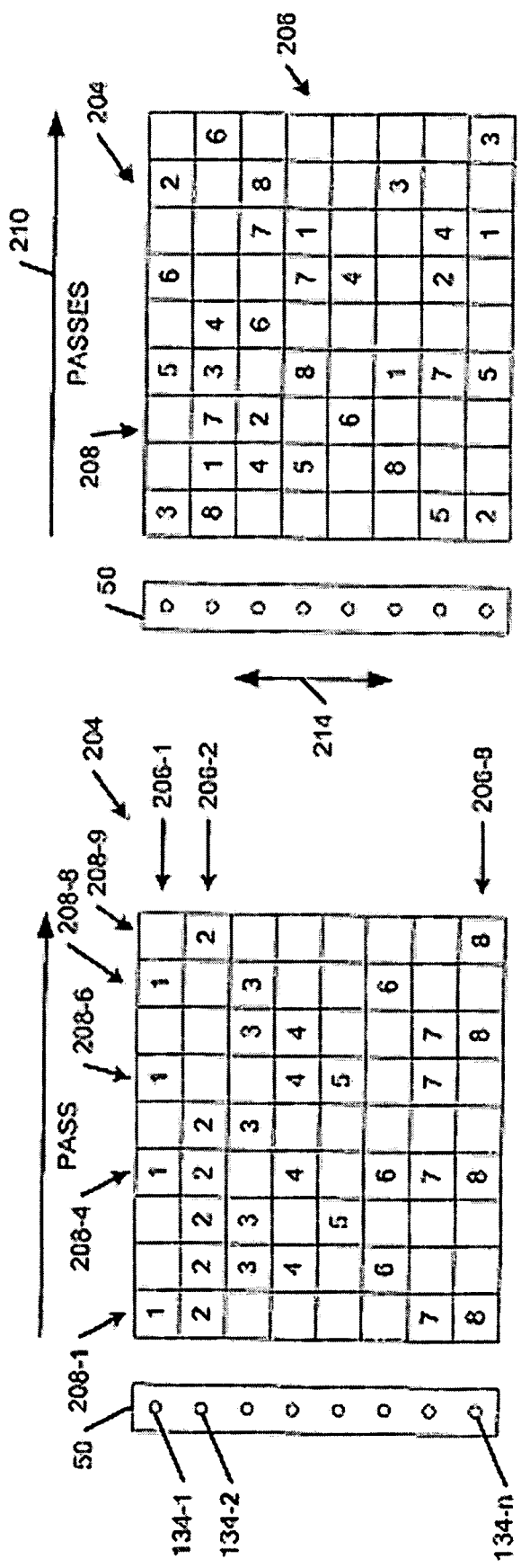
FIG.3A
FIG.3B
FIG.3C

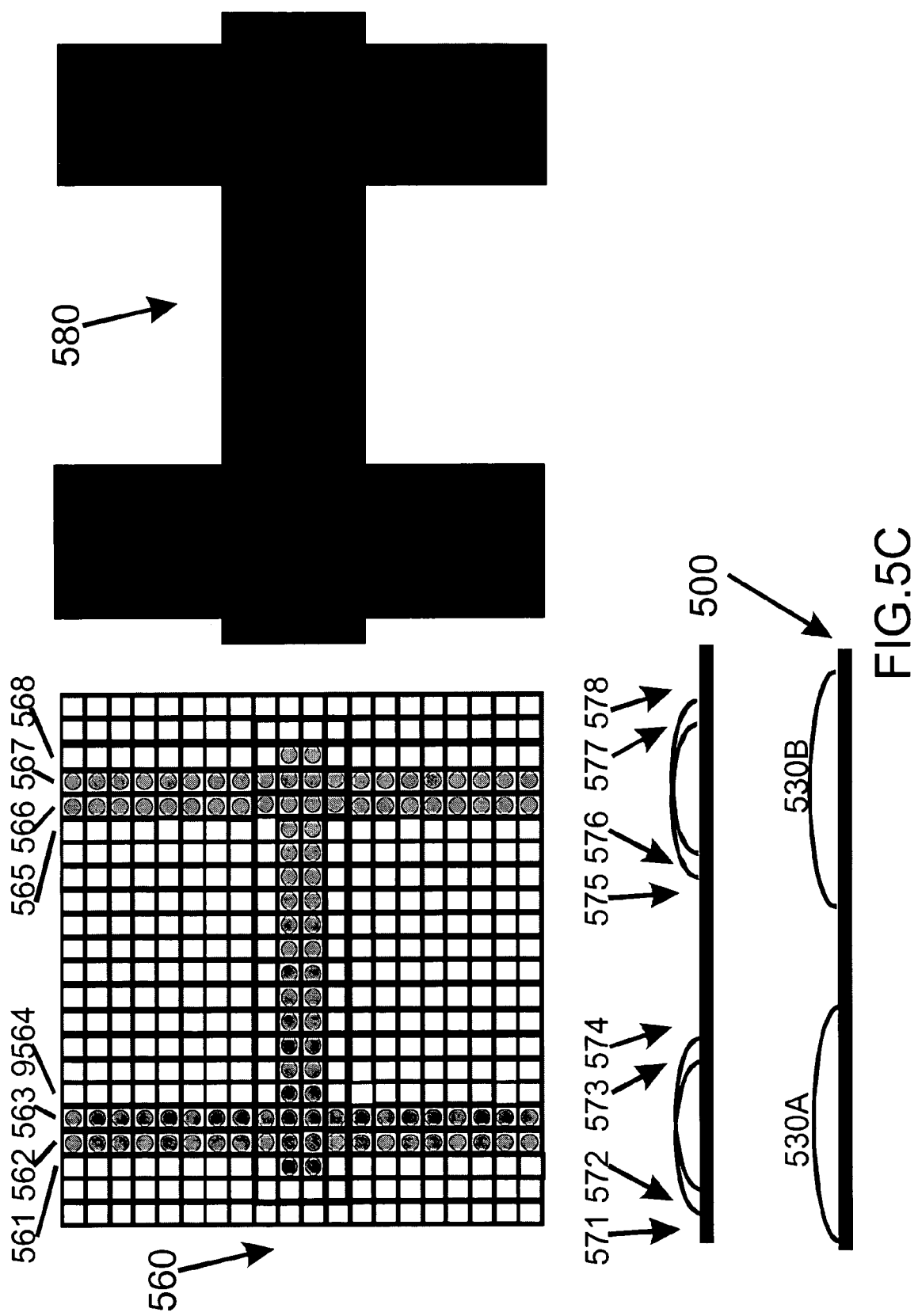

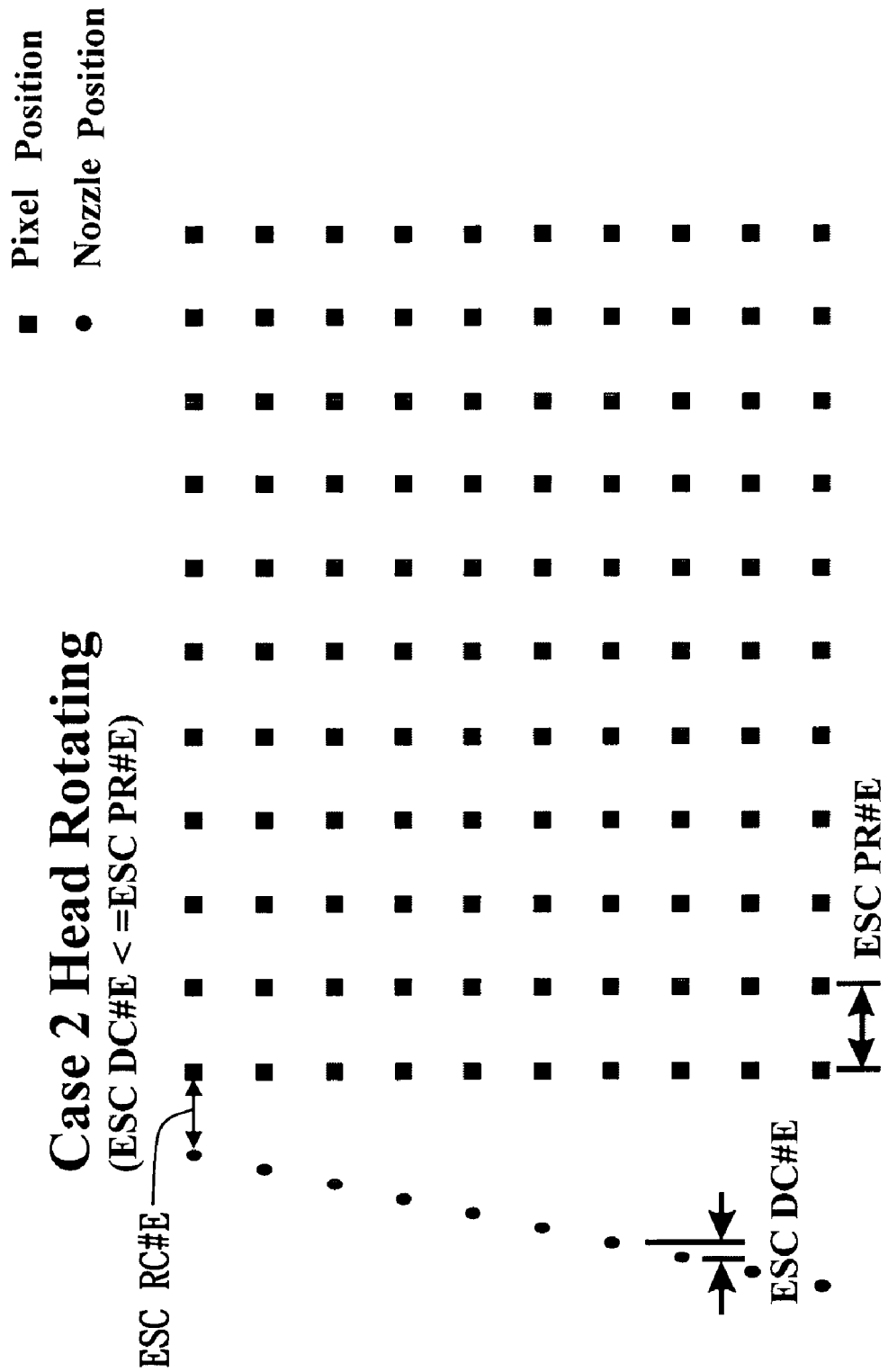

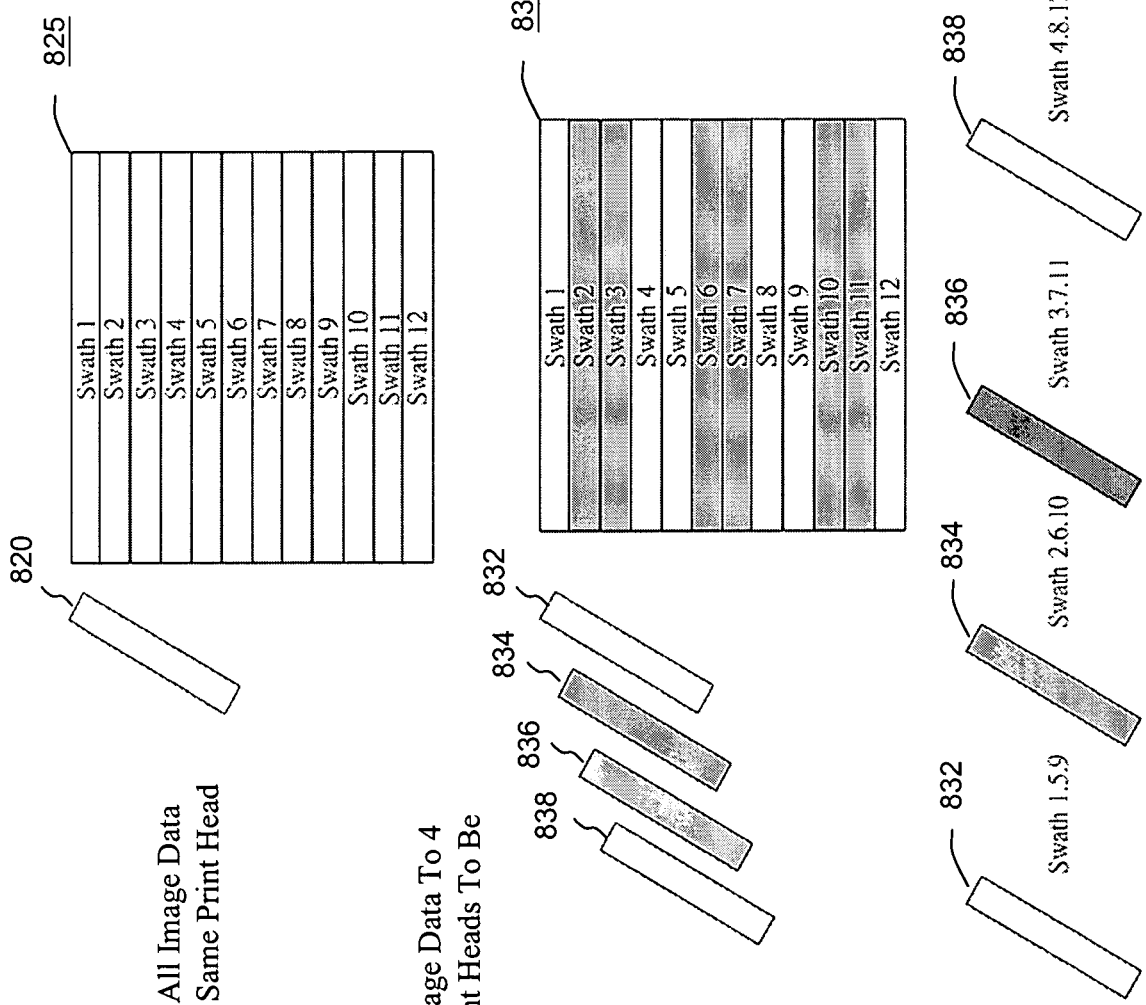

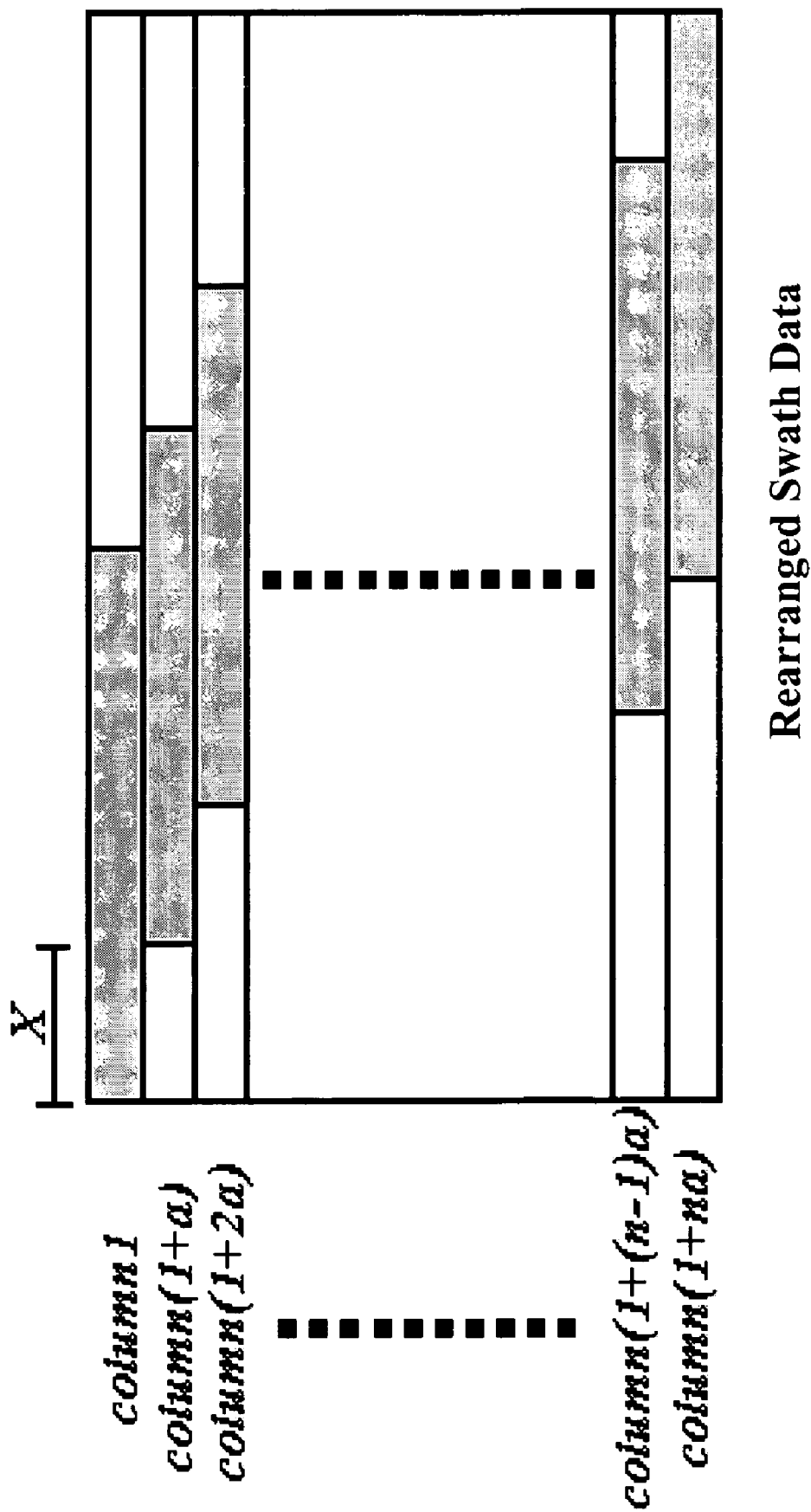

| ESC DC#E Delay Count (must be the multiple of frequency divider count ESC #X) | ESC PR#E Pattern Resolution Count (must be the multiple of frequency divider count X#E) | ESC X#E(frequency divider count) | Quotient of ESC PR#E divided by ESC DC#E(denoted as "Q") | Remainder of ESC PR#E divided by ESC DC#E(denoted as "R") |
|---|---|---|---|---|
| 1 | 10 | 1 | 10 | 0 |

The first firing is 1, 11, 21, 31, 41 ... (<=128);
The next firing is 2, 12, 22, 32, 42 ... (<=128);
The next firing is 3, 13, 23, 33, 43 ... (<=128);
The next firing is 4, 14, 24, 34, 44 ... (<=128);
The next firing is 5, 15, 25, 35, 45 ... (<=128);
The next firing is 6, 16, 26, 36, 46 ... (<=128);
The next firing is 7, 17, 27, 37, 47 ... (<=128);
The next firing is 8, 18, 28, 38, 48 ... (<=128);
The next firing is 9, 19, 29, 39, 49 ... (<=128);
The next firing is 10, 20, 30, 40, 50 ... (<=128);
And it goes back to 1, 11, 21, 31, 41 ... (<=128).

FIG.12

PATTERN PRINTING SYSTEM AND DATA PROCESSING METHOD THEREOF

CROSS-REFERENCE TO RELATED APPLICATION

This application claims the priority benefit of Taiwan application serial no. 94147501, filed on Dec. 30, 2005. All disclosure of the Taiwan application is incorporated herein by reference.

BACKGROUND OF THE INVENTION

1. Field of Invention

The present invention relates to a pattern printing system and data processing method thereof. More particularly, the present invention relates to a pattern printing system suitable for printing patterns on printed circuit boards or data format rearrangement printing used in displays and the data processing method thereof.

2. Description of Related Art

Many fabricating methods have been developed to form microstructure on a substrate, for example, the circuit on a printed circuit board. As shown at the right side in FIG. 1, many complicated steps are included in a conventional circuit printing method, for example, forming a metal film on the substrate first so as to form a lower metal film layer first, then forming a photoresist layer on top with photoresist coating, and finally, removing the photoresist layer after exposing the photoresist layer with a mask so as to form a predetermined pattern. This fabricating method is very complicated, and since it requires very expensive machines and equipments, the fabricating cost is very high. Thus, inkjet printing technology is provided for forming microstructure on a substrate.

The industrial substrates to be printed usually have fixed style and the variation thereof is not as complex as general images, thus, the data processing method thereof can be different from the inkjet printing method of general images. Here print head rotating method can be used for inkjet printing fixed style substrate. In actual application, it is impossible to have different print head resolutions for different substrate resolutions, which will increase the manufacturing cost and will require the print head to be changed frequently so as to suit different substrates and support different image formats such as JEPG, TiFF, GERBER, etc. In addition, whether there is suitable print head might be a problem too.

In the conventional inkjet printing method for fabricating microstructure on substrate, for example, in the public case of PCT No. WO 02/099848, the system modules required for light weight coated pattern printing are disclosed, which include an alignment module, a service module, a drop diagnostics module, a motion module, and a piezoelectric micro-deposition (referred to thereinafter as PMD) head support module.

It is disclosed in this public case that the size of drops is controlled by waveform or drop number. To increase printing resolution, this disclosure also uses the print head rotating method. It is also mentioned in this patent application that to print different materials with only one system, a lot of time is spent on changing the print head support module and cleaning the print heads, so to improve this situation, more than one systems are used in the product line to reduce the time spent on changing print head support module and cleaning the print heads.

In addition, a method for improving the quality of light weight pattern printing is disclosed in the public cast of PCT No. WO 02/098576. Improved alignment module, higher resolution, and better droplet control are all necessary to obtain better quality in light weight pattern printing. This patent application is mostly about the method for improving the alignment module and controlling the waveforms of various nozzles with a drop diagnostics system so as to achieve better droplet control. The method of rotating PMD print head is used for increasing vertical resolution and the over-clocking method is used for increasing horizontal resolution. The over-clocking method is to increase the clock frequency of the operation after considering the width of the droplet and the horizontal and vertical moving speeds of the print head.

For example, FIG. 2A illustrates incorrect print head driving waveforms 370-1, 370-2 . . . 370-8, which results in the corresponding droplets 374-1, 374-2 . . . 374-8 having incorrect sizes or position shifts. For example, the droplet 374-4 is too small and has wrong position, and the droplet 374-4 is too large and also has wrong position. Correct print head driving waveforms 380-1, 380-2 . . . 380-8 and correct sizes and positions of droplets 384-1, 384-2 . . . 384-8 are obtained through rotating the PMD print head and adjusting the operation clock, as shown in FIG. 2B.

Moreover, a light weight pattern printing system is disclosed in the public case of PCT No. WO 02/050260, which can print particular pattern on the substrate, and can eliminate uneven density distribution caused by abnormal nozzle operations. According to this patent application, a mask for printing a particular pattern is created and the data of each printing flow is calculated according to the mask so as to eliminate uneven density distribution caused by abnormal nozzle operations. The pattern to be formed is illustrated in FIG. 3A, and the print head 50 in FIG. 3B prints droplets at predetermined positions in rows 206-1~206-B according to nozzles 134-1~134-n. According to the light weight pattern printing system disclosed in this invention, the print head 50 can print the desired pattern through several moves (as 210 and 240) according to a mask generated by a mask generation device, as shown in FIG. 3C.

None of the aforementioned conventional technologies provides a method for printing a pattern on the substrate correctly through an algorithm or a method for storing the rearranged print data into the memory in high-speed transmission so as to achieve synchronous firing.

SUMMARY OF THE INVENTION

Accordingly, the present invention is directed to provide a pattern printing system, which prints a pattern on a substrate correctly with an algorithm.

The present invention provides a pattern printing system and data processing method thereof, which are suitable for printing patterns on printed circuit boards or data format rearrangement printing used in displays. The pattern printing method includes a process for interpreting scription data into matrix data, a procedure for modulating the print head resolution and the printing resolution, a procedure for interpreting and transmitting data commands, a procedure for rearranging memory data, and a procedure for firing data synchronously so as to achieve high-resolution printing and to continuously modulate any print data.

The present invention provides a pattern printing system, which changes the printing resolution with print head rotating method. The characteristic of the system is that the angle of the rotating modulation is related to the direction of the inkjet printing; the relativity 1 thereof is that the rotating angle of the print head allows the resolution of the nozzles vertical to the moving direction of the inkjet printing being consistent with the vertical resolution of the pattern to be printed; the relativity 2 thereof is that the rotating angle of the print head allows the resolution of the nozzles parallel to the moving direction of the inkjet printing being a multiple of the horizontal resolution of the pattern to be printed; there is not specific requirement to the data format, the rearranged print data is stored in the memory so as to achieve synchronous firing.

To achieve aforementioned and other objectives, the present invention provides a pattern printing system which includes a pattern recognition module, a printing track calculation module, a print data memory writing module, and a print head driving module. The pattern recognition module is used for receiving a print data pattern, converting and recognizing the file, and correcting the image array data according to process parameters. The foregoing process parameters are related to the hydrophilicity/hydrophobicity of the surface of the substrate, the change in the area of the points of fall created after ink landing to the substrate is referred to as spreading factor, which is an important factor for correcting image files according to process parameters described above.

The printing track calculation module calculates the rotating angle of the print head according to the image file along with the position of the print head module of the pattern printing system and the disposition of a plurality of nozzles thereof to perform block printing. The characteristic thereof is that the rotating angle is related to the direction of the inkjet printing; the relativity 1 thereof is that the rotating angle of the print head allows the resolution of the nozzles vertical to the moving direction of the printing being consistent with the vertical resolution of the pattern to be printed; the relativity 2 thereof is that the rotating angle of the print head allows the resolution of the nozzles parallel to the moving direction of the printing being a multiple to the horizontal resolution of the pattern to be printed; the rearranged print data is stored into the memory to achieve synchronous firing.

The print data memory writing module rearranges the swath data of the image file and writes the rearranged data into a memory. The print head driving module is used for driving the print head and the nozzles of the pattern printing system in the printing area according to the rearranged print data so as to form the corresponding image of the image file. The characteristic of the memory data rearrangement procedure is that the memory data is arranged in the horizontal timing sequence of the printing movement according to the selected nozzle data and the converted swath data, the memory data is a m*N memory swath, wherein N is the number of selected nozzle data, m is memory data arranged in the horizontal timing sequence of the printing movement, and having the number of triggering signals (generally the differential signals of an optical linear scale) or the multiple thereof. In particular, the data printed by the foregoing m*N matrix data presents a parallelogram data structure because of the rotating angle of the print head, and the parallelogram data is related to the number of selected nozzles and trigger signals.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A~2B are diagrams illustrating a conventional method for improving the printing quality of light weight coated pattern.

FIGS. 3A~3C illustrate a conventional light weight coated pattern system, wherein FIG. 3A illustrates the pattern to be printed, FIG. 3B illustrates the predetermined printing positions of the print head based on nozzles, and FIG. 3C illustrates that the print head can print according to a mask generated by a mask generating apparatus.

FIG. 5C illustrates an image of an image file printed after being calculated with the optimized algorithm in an embodiment of the present invention.

FIGS. 7A~7B are diagrams illustrating a method for aligning nozzles and raster data resolutions according to an embodiment of the present invention.

FIG. 8D is a diagram illustrating the correspondence between the swath data and the print heads after an image is divided into swath data according to an embodiment of the present invention.

FIGS. 10A~10C are diagrams of a method for rearranging the image data according to an embodiment of the present invention, which illustrate the process of taking out nozzle data corresponding to swaths from an image file to be integrated into an array, and rearranging the data according to the rotating angle of the print head.

FIGS. 11A~11C are diagrams illustrating a print head driving method according to an embodiment of the present invention, wherein FIGS. 11A and 11B illustrate the driving timing when the print head enters a printing area after the print head rotates an angle, and FIG. 11C is a diagram of a print head driving module according to an embodiment of the present invention.

FIG. 12 is a diagram illustrating the method of adjusting the nozzles of the print head to trigger printing according to an embodiment of the present invention.

DESCRIPTION OF EMBODIMENTS

The conventional inkjet printing method has fixed optimal printing resolution and prints in interlacing manner, so that it is impossible to print a pattern with different resolutions.

In the present invention, print head rotating and interlaced printing are used to change the resolution vertical to printing direction, and timing control is used for modulating the resolution parallel to printing direction. Such design can accomplish correct printing of the image data at every position and prevent printing distortion which causes "mura" in displays. "Mura" refers to the appearance of various marks caused by uneven brightness of the display. The simplest way to judge Mura is by switching the display to black image and other low grey scale images and observing the display from different viewpoints, and the LCD has various Mura due to various process defects.

Figure 1:
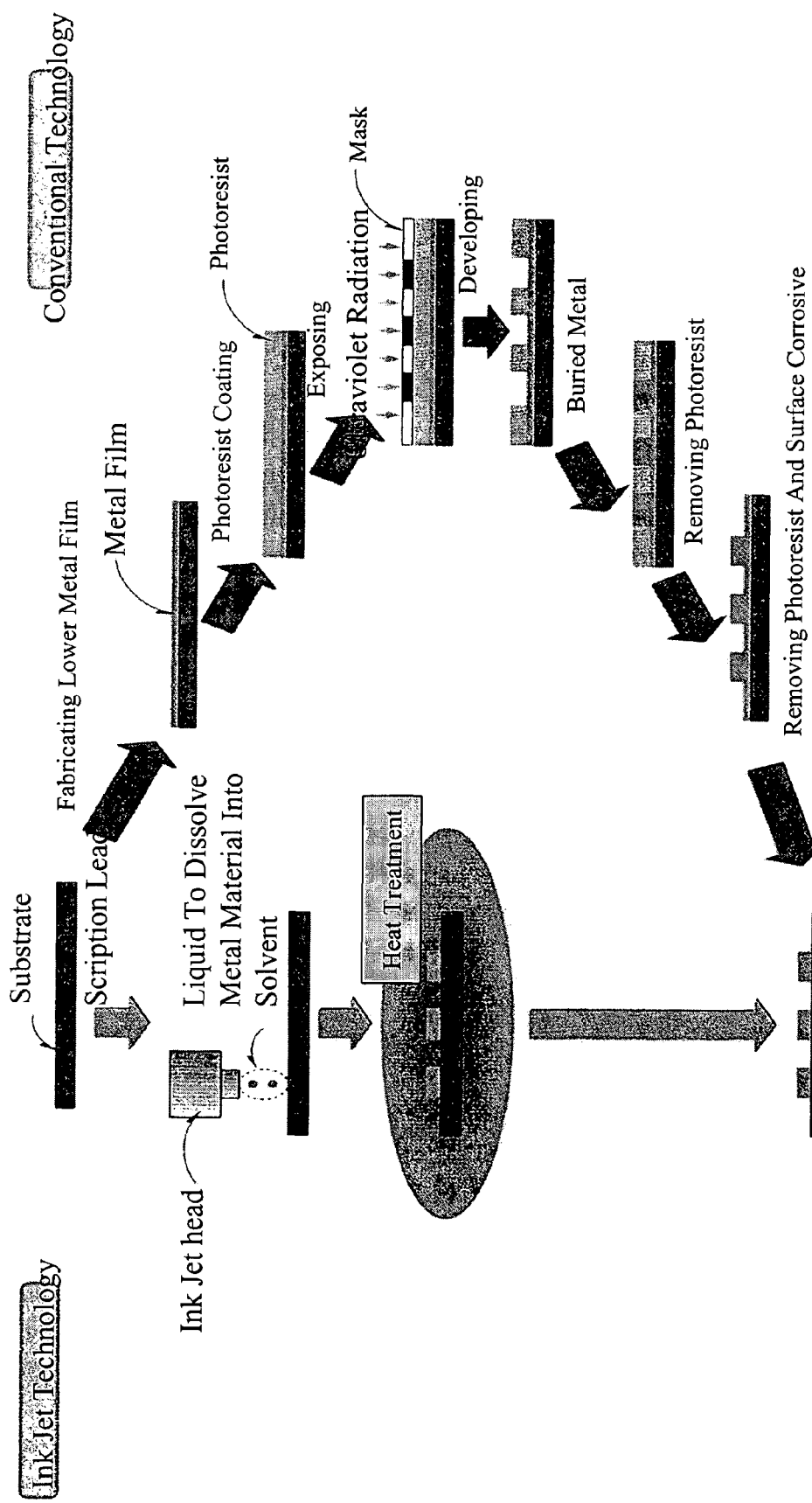
FIG. 1 is a diagram illustrating a conventional method for fabricating printed circuit board.
Figure 4A:
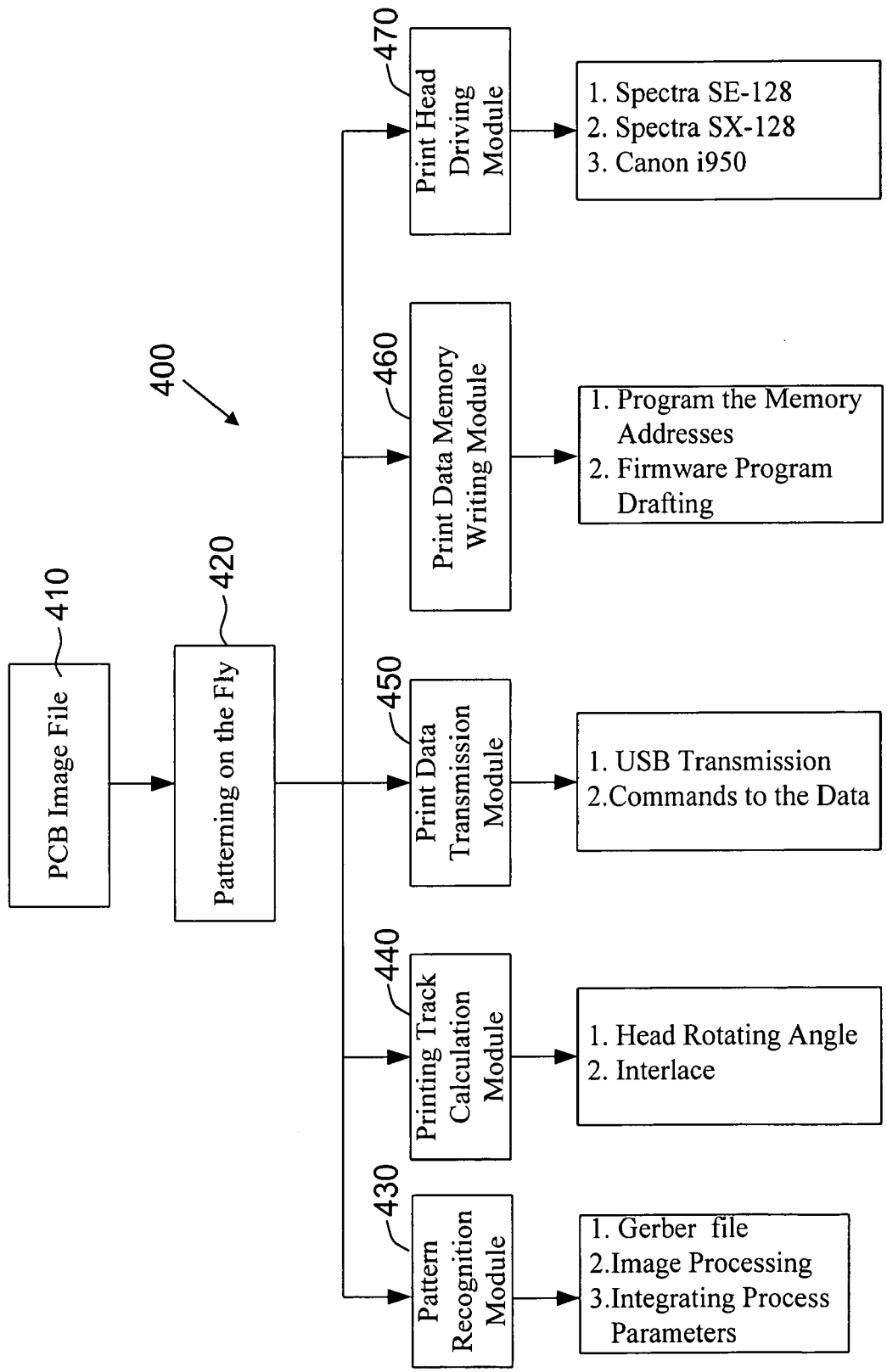
FIG. 4A is a diagram illustrating a pattern printing system according to an embodiment of the present invention.

As shown in FIG. 4A, the pattern printing system of the present invention includes a pattern recognition module 430, a printing track calculation module 440, a print data transmission module 450, a print data memory writing module 460, and a print head driving module 470. While the image file of the circuit layout pattern designed for a printed circuit board (referred to thereinafter as "PCB") 410 is sent to the pattern printing system 400, that is, the pattern is online to be printed, such as the pattern on the fly 420 as shown in FIG. 4A, the image file 410 is converted through the pattern recognition module 430 so as to be optimized. The conversion procedure includes converting the image file 410 of the format which is suitable to being printed by a plotter, for example, Gerber format, into printable data format of the pattern printing system 400 through image processing. In the present embodiment, the PCB image file 410 is only used for description, not for limiting the present invention, for example, it can be used for data format rearrangement printing used in displays as well. In addition, according to the present invention, the printable data format converted by the conversion procedure is also integrated with the process parameters of the pattern printing system 400 so as to achieve the process of the optimized algorithm, and this is described in detail below.

The printing track calculation module 440 calculates the rotating angle of the print head according to parameters such as the resolution required by pattern on the fly 420 and the size of the droplets, along with the position of the print head and the disposition of the nozzles thereof. Then, for example, the image to be printed is divided into different swaths and is printed according to a swath by swath pattern. Or the swaths can be printed with interlace patterning. After calculating the rotating angle of the print head and the droplet control, the print data transmission module 450 transmits the data to be printed and the commands corresponding to the data through, for example, the universal serial bus (referred to thereinafter as USB). After that, the print data memory writing module 460 programs the memory addresses of the received print data and the commands corresponding to the data. The nozzle data corresponding to every swath is taken out from the image file and is integrated into an array. The data is rearranged according to the rotating angle of the print head through the programming of a firmware program. Next, the rearranged print data is driven by the print head driving module, so that the nozzles of the print head perform inkjet printing operation according to the corresponding driving timing when the nozzles enter the inkjet printing area. The print head driving module may be Spectra SE-128, Spectra SX-128, or Canon i950, or any print head driving module in this field.

Figure 4B:
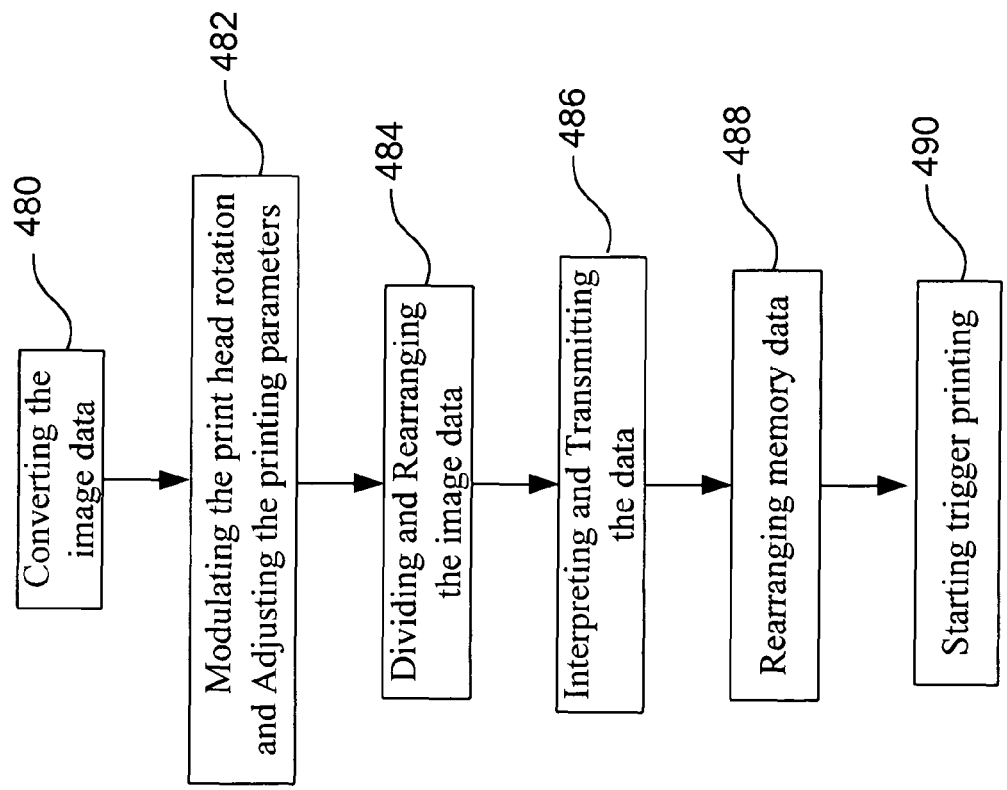
FIG. 4B is a diagram illustrating a pattern printing system according to an embodiment of the present invention.

As shown in FIG. 4B, the pattern printing method of the present invention includes the following steps: first, converting the image data in step 480; then, modulating the print head rotation and adjusting the printing parameters in step 482; next in step 484, dividing and rearranging the image data; after that in step 486, interpreting and transmitting the data; then rearranging memory data as in step 488; after that in step 490, starting trigger printing.

Referring to FIGS. 4A and 4B, the pattern printing system and method of the present invention include the following characteristics; please refer to the description below.

Figure 5A:
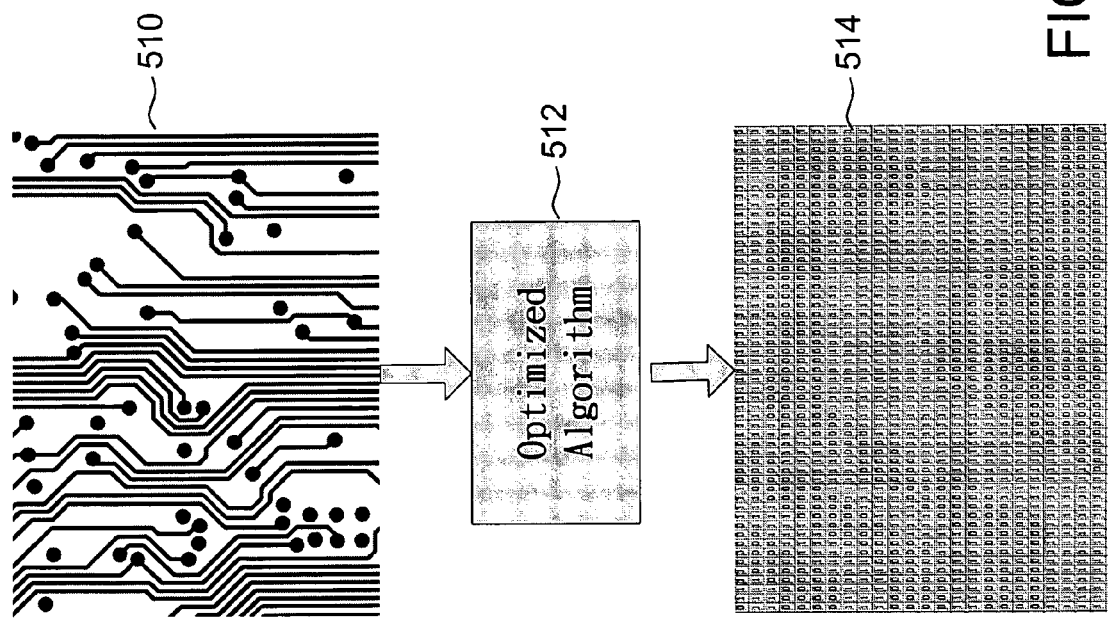
FIG. 5A illustrates that an image file to be printed is converted into a binary image array data through an optimized algorithm according to an embodiment of the present invention.
Figure 5B:
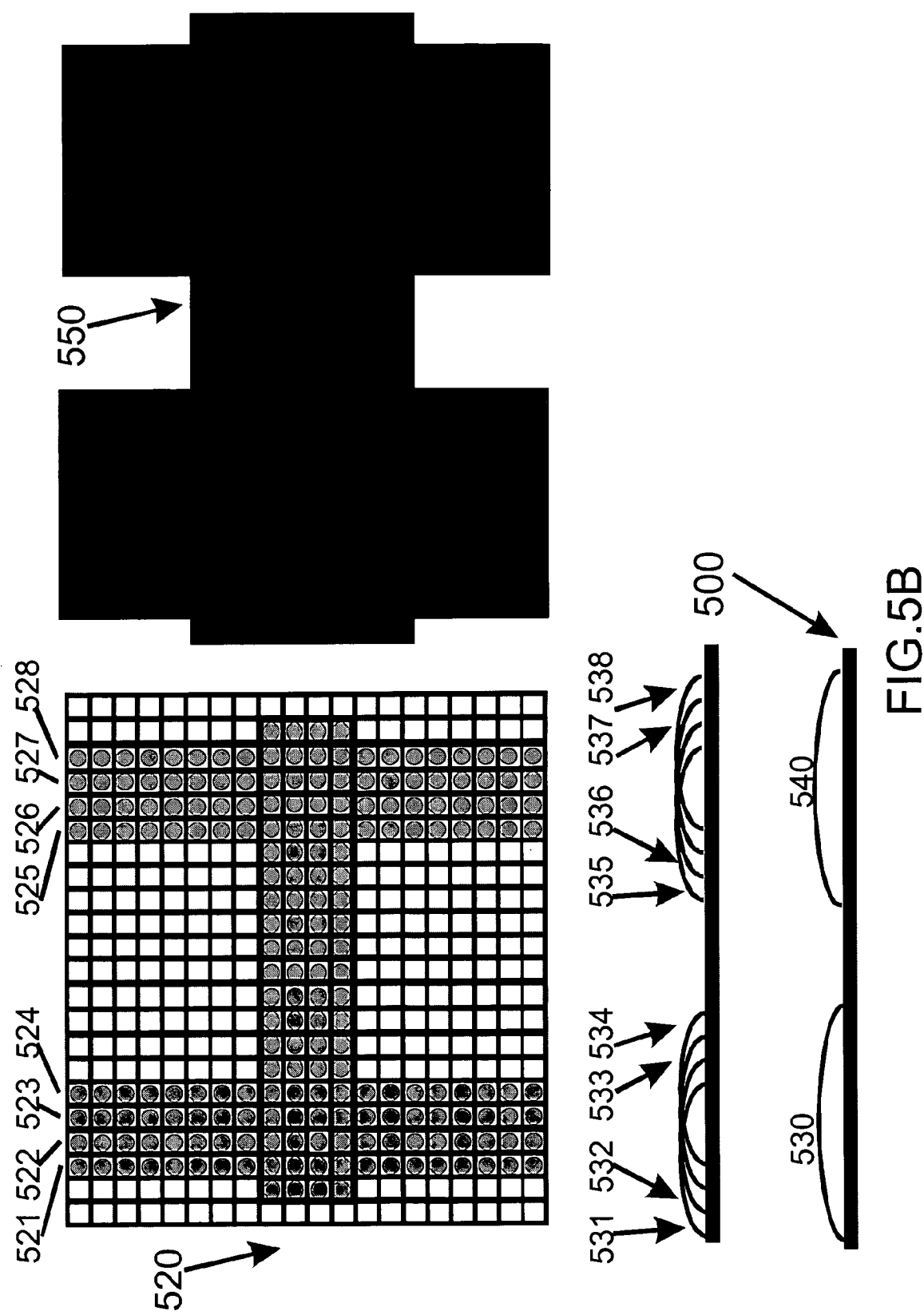
FIG. 5B illustrates an image of an image file conventionally printed.
Figure 5D:
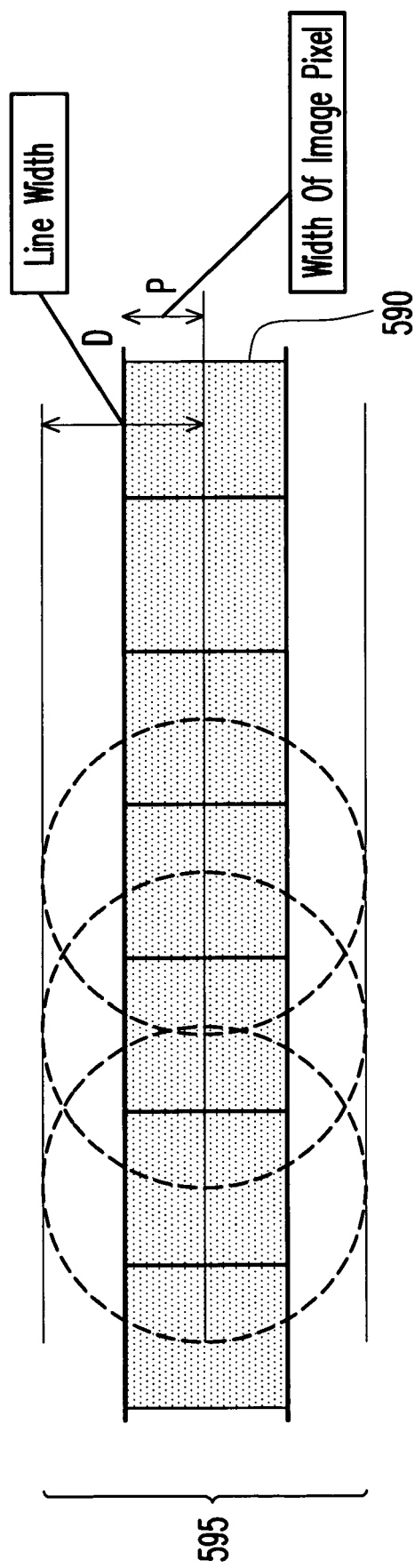
FIG. 5D illustrates that lines of different resolutions (dot pitches) are printed through a single nozzle and the diffusion degrees thereof are observed to set up a database of resolutions corresponding to diffusions.

Image File Format Conversion:

As shown in FIG. 5A, in an embodiment, the image file 510 of Gerber format which is suitable to being printed by plotter is converted into a binary image array data through the optimized algorithm process 512 of the present invention, for example, a PCB circuit pattern is converted into a digital data, or the RS274X format is converted into a binary image array data as the binary image array data 514 in FIG. 5.

In the present embodiment, different patterns can have different adjustment parameters, which may be parameters in consideration of differences in the process, so that the requirements in the process can be fulfilled. In addition, in a selected embodiment, the image data is corrected with the parameters of the printing process so as to achieve high quality printing pattern. The aforementioned correcting image with pattern adjustment parameters is described with reference to FIG. 5B.

520 is a standard image which has waiting print data 521, 522, 523, 524, 525, 526, 527, and 528, and the drop landing is on the substrate 500, due to print overlay, overlays occur between ink dots such as 531, 532, 533, 534, 535, 536, 537, and 538, and because of the wetting behavior, the finally presented image file 550 with the created line widths 530 and 540 is greater than the expected representation with the line widths 521~524 and 525~528 of the original image file 520. To resolve this difference, the image file is trimmed, and in the trimming flow, the image file 520 is corrected based on the flow condition of the drop landing on the substrate 500, which is referred to as the spreading factor. The corrected result is as shown in FIG. 5C.

560 is a standard image, which has waiting print data 561, 562, 563, 564, 565, 566, 567, and 568, and the drop landing thereof is on the substrate 500, the image file 560 of the standard image is corrected, that is, the image file is trimmed, in consideration of characteristics of the hydrophilicity/hydrophobicity process parameter of the surface of the substrate. The flow condition of the drop landing on the substrate 500 in the trimming flow is referred to as spreading factor. The line widths 530A and 540A created after correcting the ink dots 571, 572, 573, 574, 575, 576, 577, and 578 can meet the original line width expectation of 561~564 and 565~568. Thus, the size of the image file 580 finally printed is the same as the size of the original image file 560.

The entire flow is: (1) taking out various sub-characters, such as the waiting print data 561, 562, 563, 564, 565, 566, 567, and 568 etc., from the original image file through image recognition; (2) since the expected spreading factors being different-according to different characteristics, establishing image modification according to various sub-characters; (3)

recombining various corrected sub-characters, establishing corrected image file; and (4) print data according to the image file.

An embodiment of the conversion method described above is as shown in FIG. 5D, which illustrates that a line of different resolutions (dot pitches) is printed through a single nozzle and the diffusion degrees thereof are observed to set up a database of resolutions corresponding to diffusions. Besides, a particular pattern can be printed to find out the optimal printing condition. Assuming the width of image pixel to be P, then a line of width P becomes the line 590 as in FIG. 5D which is made up of a single line of pixels. However, the width D of the line 595 formed when the ink droplets are jetted on the substrate according to the pattern is different from the width P of the image pixel. This is because the size and shape of a droplet are different from those of a pixel, and the overlapping of several droplets will also affect the width of the line. The value (D-P) is the correction value to the original image in the current resolution (dot pitch). Since the diffusion degree may be related to a plurality of parameters, such as the ink solution, the surface treatment of the substrate, the printing dot pitch etc., the conversion method can be set as the following function (1):

$$D=f(\text{solution trait, substrate surface treatment, resolution}) \quad (1)$$

The width of the line can be trimmed by only adjusting one the parameters. Generally speaking, the resolution and printing dot pitch are adjusted in an exemplary embodiment.

Figure 6:
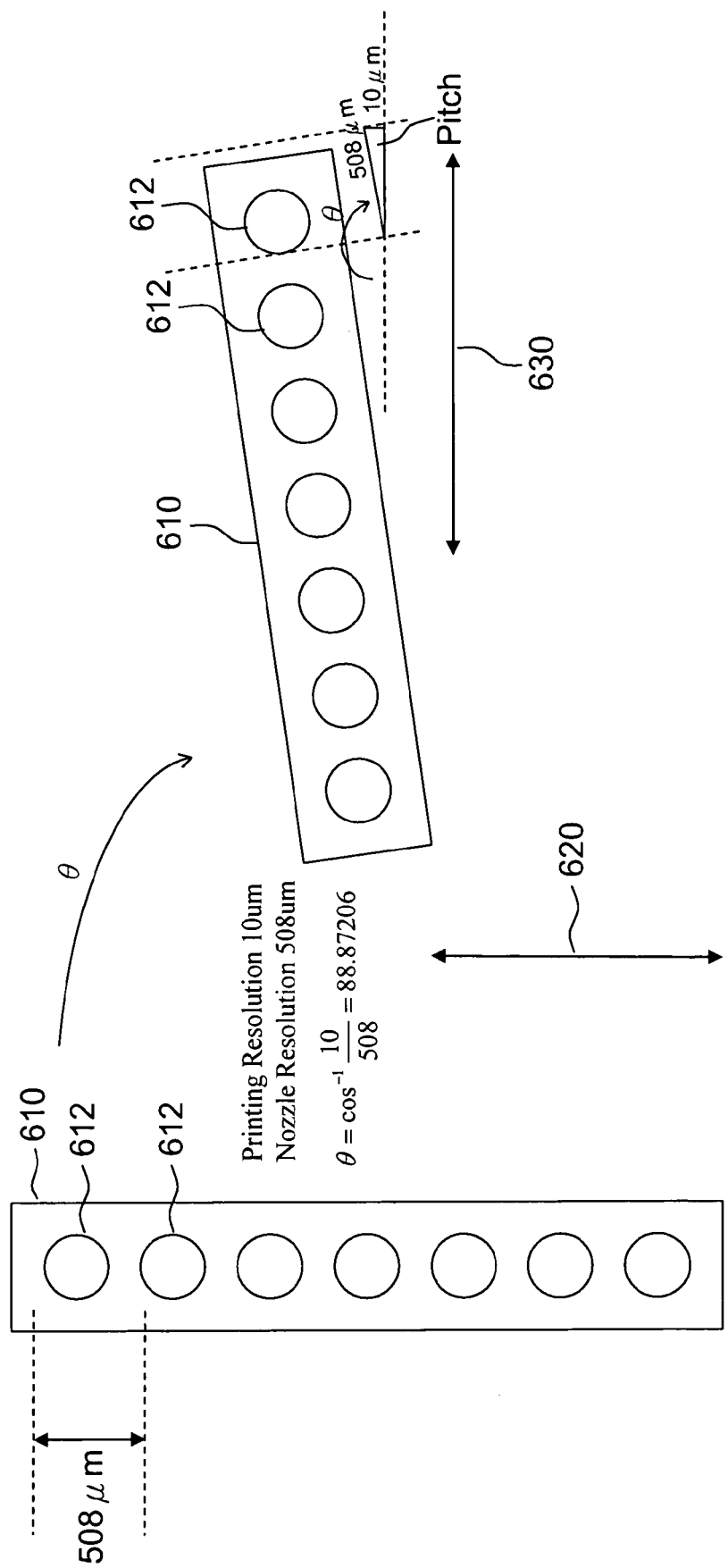
FIG. 6 illustrates a method for adjusting print head according to an embodiment of the present invention.

The Conversion of the Print Head Adjustment:

As shown in FIG. 6, in an embodiments it is assumed that the printing resolution is 10 um and the resolution between two adjacent nozzles 612 of the print head 610 is 508 um. To accomplish the printing resolution, the print head 610 has to be rotated an angle θ so that the print head 610 is vertical to the moving direction (direction 620) of the print head 610 relative to the substrate, the change in the pitch of the print head. The moving direction of the substrate is as direction 630 in FIG. 6. The pitch as shown in FIG. 6 is converted into the required resolution 10 um from the original 508 um and is parallel to the moving direction of the print head 610 relative to the substrate. The firing timing of the print head 610 is also adjusted along with the change of the rotating angle of the print head 610.

Alignment Between Nozzle Positions and Raster Data Resolutions:

Raster data is a raster-based patterning method, wherein, the pattern is stored in the memory in dark and clear formats first before it is printed. According to this method, the clear areas contained in a large dark area can be hitched together to form a correct pattern. This method uses less time and data if compared to conventional printing methods, for example, vector-based patterning.

In an embodiment, an alignment method regarding the nozzle position and raster data resolution in the raster-based patterning is provided. Several variable parameters are defined below. "ESC PR#E" is the pattern resolution count, which is the spacing of each pixel when the image file is printed. "ESC DC#E" is the pattern delay count, which is the encoder count difference caused by angle rotation of the nozzle of each print head. "ESC RC#E" is the pattern runway count, which is the count of the distance from the first nozzle to the first position to be printed. "ESC X#E" is the trigger density count, which defines that the firing is controlled after how many position signals have been received.

There are four possibilities, the details thereof will be described in the following embodiments, and the possibilities include:

The first possibility: ESC DC#E is smaller than or equal to ESC PR#E, and the remainder R of ESC PR#E divided by ESC DC#E is 0.

The second possibility: ESC DC#E is smaller than or equal to ESC PR#E, and the remainder R of ESC PR#E divided by ESC DC#E is not 0.

The third possibility: ESC DC#E is greater than ESC PR#E, and the remainder R of ESC DC#E divided by ESC PR#E is 0.

The fourth possibility: ESC DC#E is greater than ESC PR#E, and the remainder R of ESC DC#E divided by ESC PR#E is not 0.

Figure 7B:
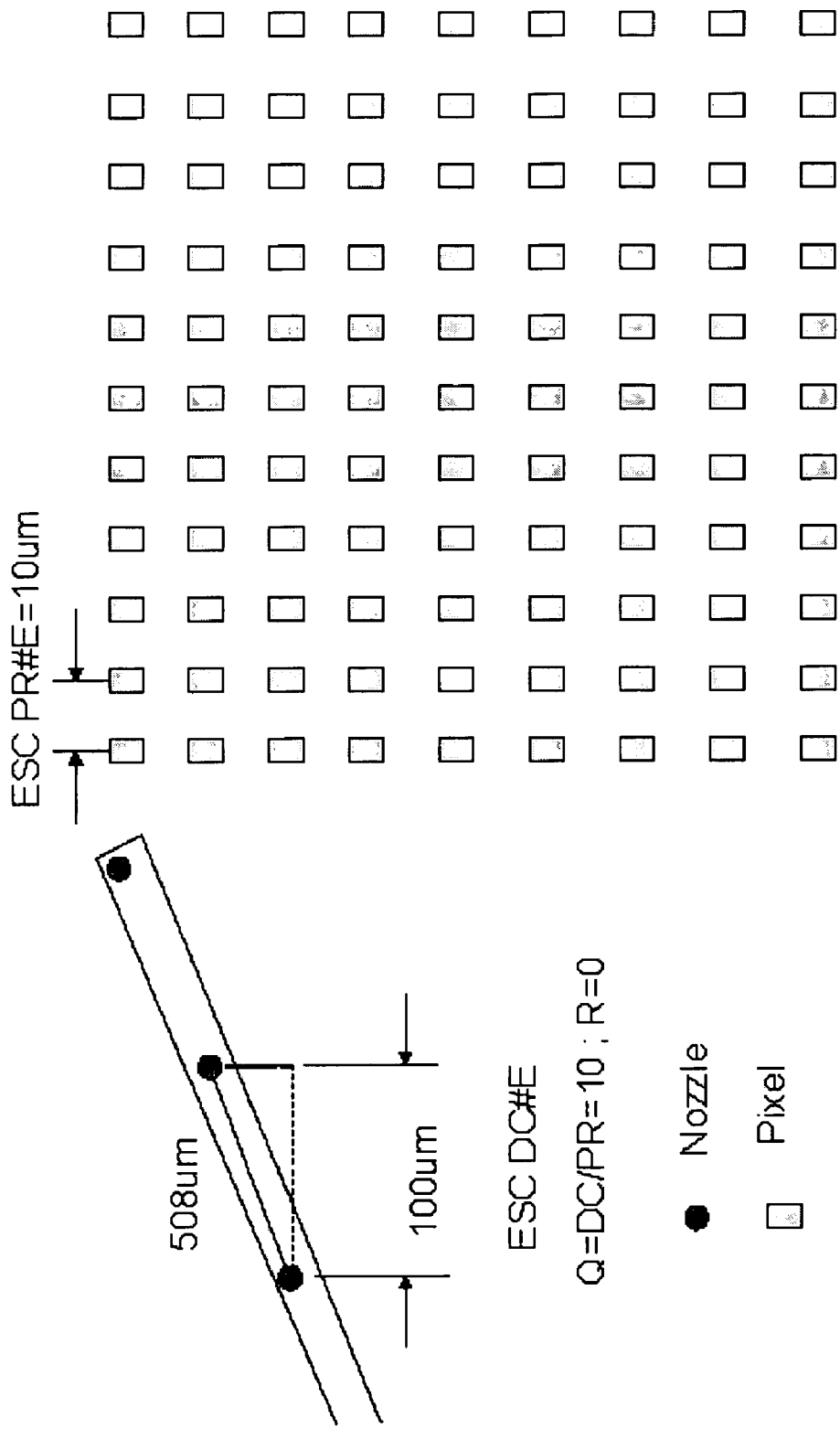

Please refer to FIG. 7A for the first and second situations and FIG. 7B for the third and the fourth situations described above. For example, as shown in FIG. 7B, ESC DC#E is 100 um, and ESC PR#E is 10 um, thus, the quotient Q of ESC DC#E divided by ESC PR#E is 10 and the remainder R is 0. The calculations of these situations will be described in the following embodiments.

Dividing and Rearranging Image Data

The print data memory writing module rearranges the swath data of the image file and writes the rearranged data into a memory. The print head driving module is used for driving the print head and the nozzles of the pattern printing system in the printing area according to the rearranged print data so as to form the corresponding image of the image file. The characteristic of the memory data rearrangement procedure is that the memory data is arranged in the horizontal timing sequence of the printing movement according to the selected nozzle data and the converted swath data, the memory data is a m*N memory swath, wherein N is the number of selected nozzle data, m is memory data arranged in the horizontal timing sequence of the printing movement, and having the number of triggering signals (generally the differential signals of an optical linear scale) or the multiple thereof. In particular, the data printed by the foregoing m*N matrix data presents a parallelogram data structure because of the rotating angle of the print head, and the parallelogram data is related to the number of selected nozzles and trigger signals.

Figure 8A:
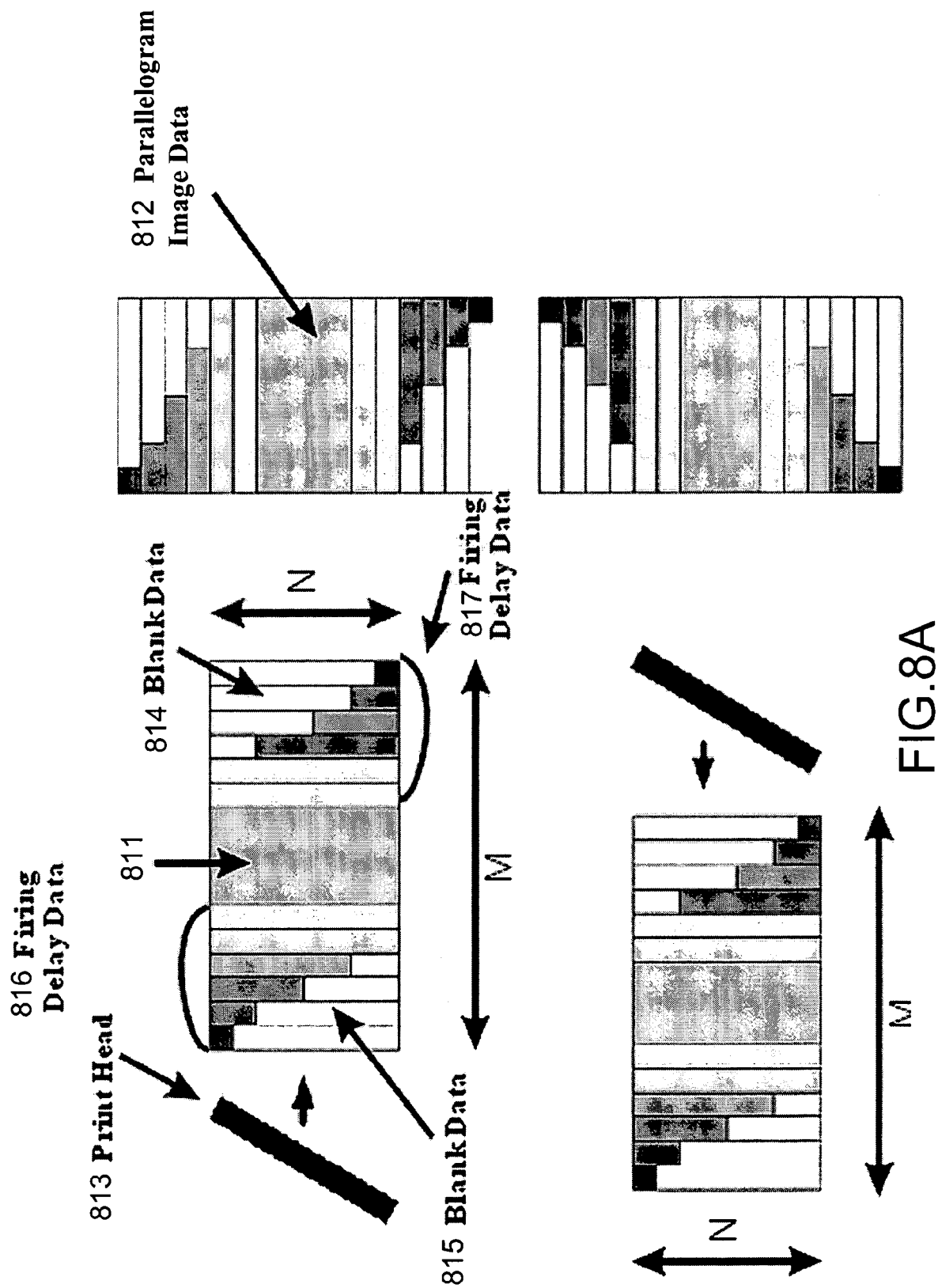
FIG. 8A is a diagram illustrating storing an image into memory according to an embodiment of the present invention.

As shown in FIG. 8A, the main structure includes a print head 813, image data 811, converted data 812 (as the parallelogram image conversion data in FIG. 8A) stored in the memory, blank data 814 and 815, firing delay data 816 and 817. The direction of the parallelogram data is reversed to the direction as shown in FIG. 8A if the printing is inverted.

Figure 8B:
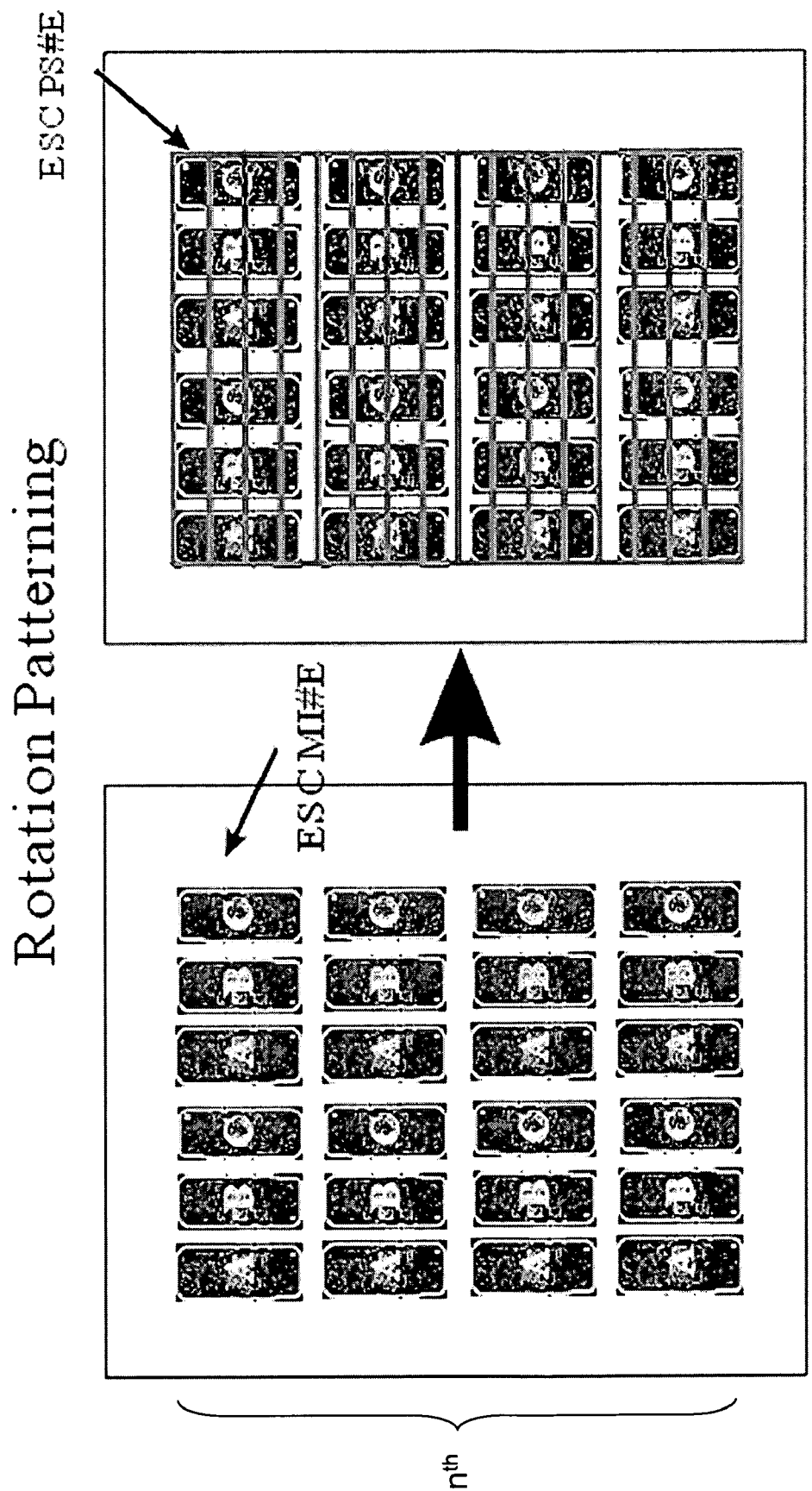
FIG. 8B is a diagram illustrating printing swath data in swath by swath pattern after an image is divided into swath data according to an embodiment of the present invention.
Figure 8C:
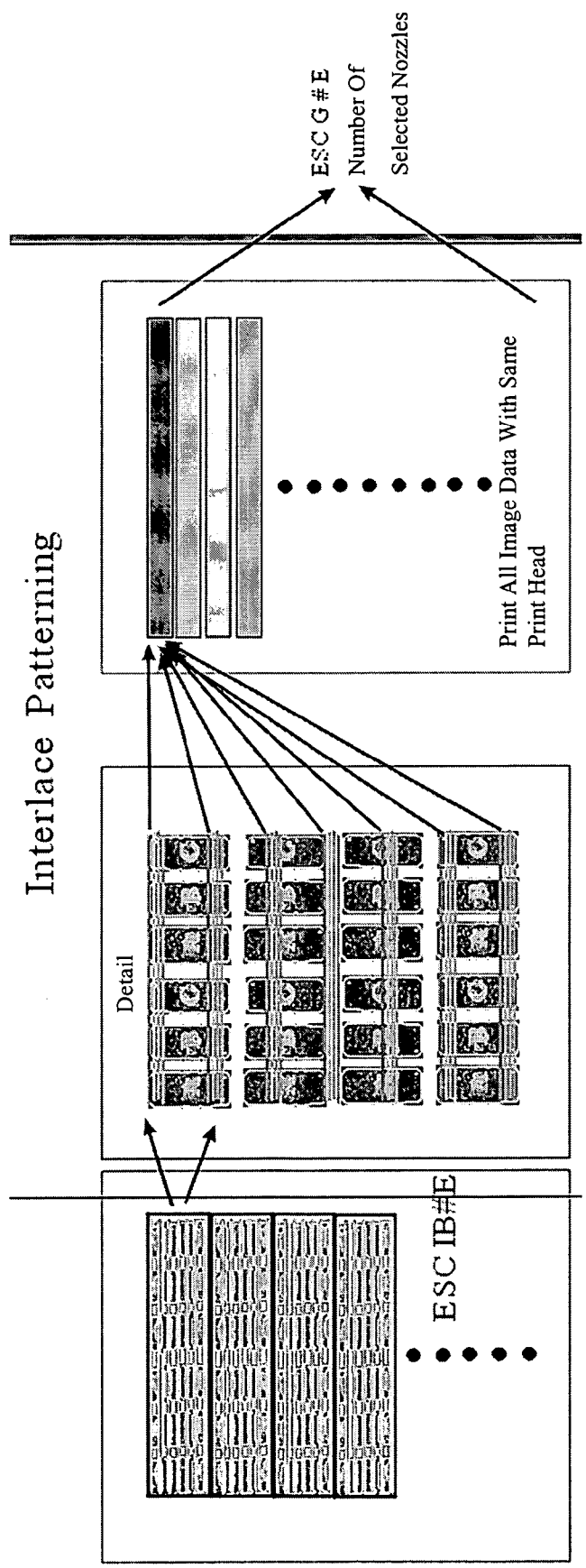
FIG. 8C is a diagram illustrating printing swath data in interlace patterning manner after an image is divided into swath data according to an embodiment of the present invention.

Swath Data Image Division:

According to an embodiment of the present invention, two printing methods as shown in FIGS. 8B and 8C can be used, the first method is swath by swath pattern printing, and the other one is interlace patterning printing.

Referring to FIG. 8B for the first method, wherein, the print head is rotated to a particular angle (which is adjusted to the optimal status according to the foregoing calculation) first, and then the image file is printed swath by swath. The data of the original image file is divided according to the selected nozzle number m and swath number n, and every time m rows of swath image data is divided and transmitted to the hardware to be printed and this is repeated n times to print the swaths sequentially.

The "MI" of "ESC MI#E" in FIG. 8B represents memory initiation, and "ESC MI#E" represents the initiation of the data of the $E^{th}$ swath. The "PS" of "ESC PS#E" in FIG. 8B is the pattern swath, and "ESC PS#E" represents the image data, which is divided into several swath data, to be transmitted on a substrate, which is only applicable to the situation of angle rotation. Actually, the situation of angle rotation can be considered as the special case of number of the interlace swaths being 1 and M rows of nozzle data are take every time.

In addition, referring to FIG. 8C for the second method, wherein, every time the $1^{st}$, $(n+1)^{th}$, ... $(2n+1)^{th}$ ... $(mn+1)^{th}$ row of the original image data is transmitted according to the selected nozzle number m and swath number n, and in total m rows of image data are combined into the content of the first memory swath to be printed sequentially. Next time the image data of the $2^{nd}$, $(n+2)^{th}$, $(2n+2)^{th}$ ... $(mn+2)^{th}$ row is transmitted, and in total m rows of image data are combined into the content of the second memory swath to be printed sequentially. Accordingly, n swaths of data are printed in sequence.

The "IB#E" of "ESC IB#E" as shown in FIG. 8C represents the $E^{th}$ interlace swath, that is, marking how many memory swaths there are in the interlace image file. For example, when a data has 1000 rows and 128 nozzles are used, there are 1000/128=8(rounded) memory swaths in total. Certainly, a part of the data in the $8^{th}$ memory swath is 0, which means the data is not printed, but is still transmitted to overlay the memory data, and this is only applicable to the situation of interlace swaths. The "ESC G#E" in FIG. 8C represents the number of nozzles selected.

FIG. 8D illustrates the more detailed concept. If the number of nozzles driven by a independent print head is N, the number of print heads is P, then an original image having X rows (the direction of the rows is parallel to the direction of ink jetting) can be divided equally into X/N swaths (X is divided exactly by N) or (X/N+1) swaths (X is not divided exactly by N). As shown on the top of FIG. 8D, when the same print head 820 is used for printing all the images, then the image having 12 rows can be divided into 12/1=12 swaths according to the number of nozzles selected, which is 1, as the 12 swaths as shown in FIG. 8D. If the image data are distributed to four different print heads, such as the print heads 832, 834, 836, and 838, to be printed, and the original image has 12 rows, then it can be divided equally into 12/4=3 swaths. As shown in FIG. 8D, the print head 832 is corresponding to swath 1, 5, and 9, the print head 834 is corresponding to swath 2, 6, and 10, the print head 836 is corresponding to swath 3, 7, and 11, and the print head 838 is corresponding to swath 4, 8, and 12.

Figure 8E:
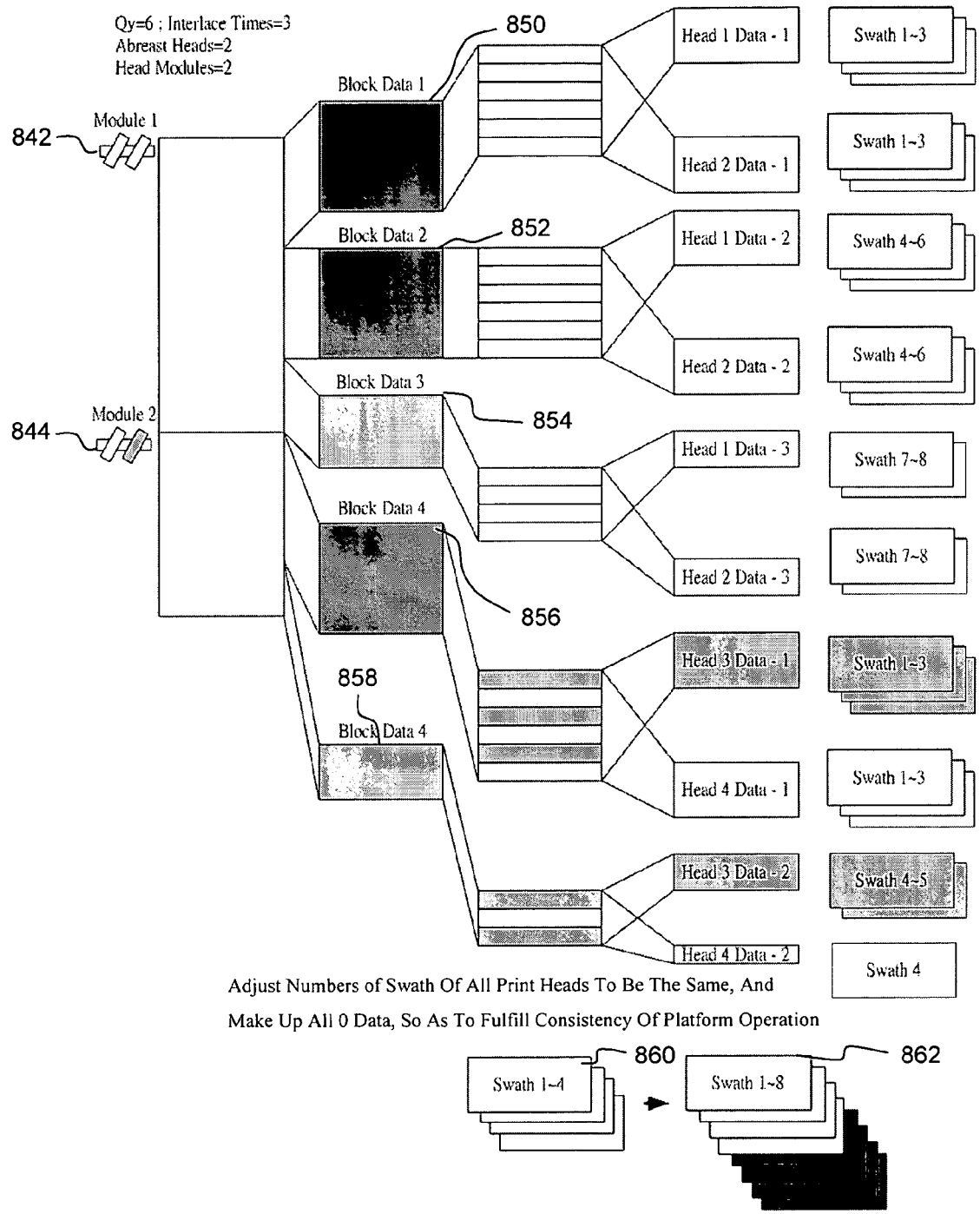
FIG. 8E is a detailed diagram illustrating the correspondence between the swath data and the print heads after an image is divided into swath data according to an embodiment of the present invention.

The data division and distribution method with multiple print heads structure is further illustrated in FIG. 8E. The sizes of the originally defined image data of the print head modules of module 1 (842) and module 2 (844), for example, the data of module 842 is swaths 1~3, i.e. swaths 850, 852, and 854 in FIG. 8E, and the data of module 844 is swaths 4~5, i.e. swaths 856 and 858 in FIG. 8E. To make the data format consistent, blank data (i.e. the data which will not trigger printing) is filled into the print head of the module having less data with interpolation, so that the data number thereof is the same as that of the print head of the largest module. Accordingly, all the modules and all the print heads have the same printing swath data. Printing without blank spacing can be achieved with this design regardless of whether the original image data on the substrate is compatible with the inkjet printing modules.

Figure 9:
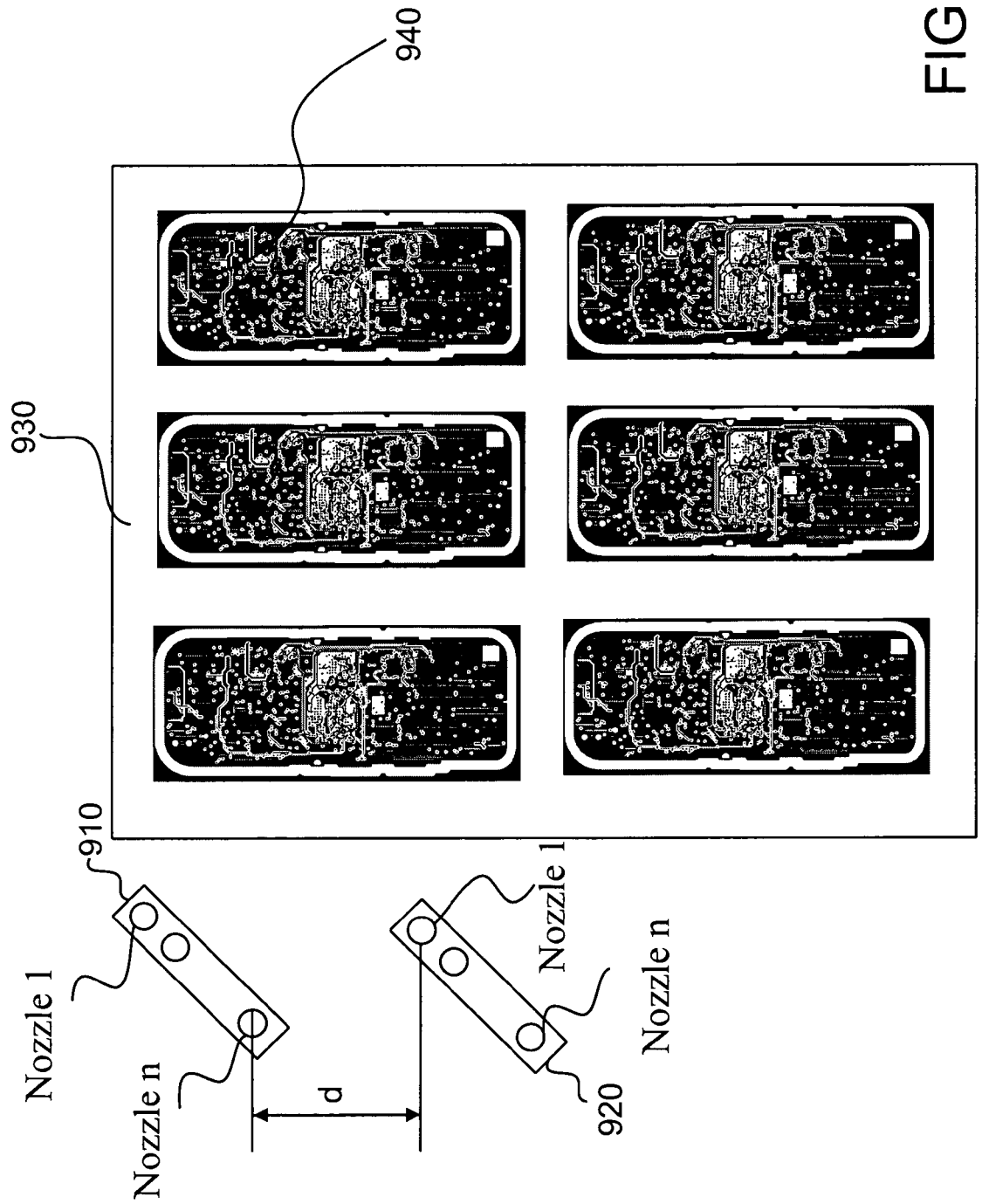
FIG. 9 is a diagram illustrating the method of calculating each swath data based on the number of print heads and nozzles besides the method of calculating print head angle based on printing resolution according to an embodiment of the present invention.

Printing Track Calculation:

In an embodiment, besides calculating the printing angle according to the printing resolution, the print data of each swath can also be calculated according to the number of print heads and the number of nozzles. As shown in FIG. 9, two print heads 910 and 920 are used to print data, and each print head has n nozzles. Then with the variable printing angle plus more printable resolutions based on the two print heads and the n nozzles, a more feasible printing method is provided to different requirements of the PCB industry.

Figure 10A:
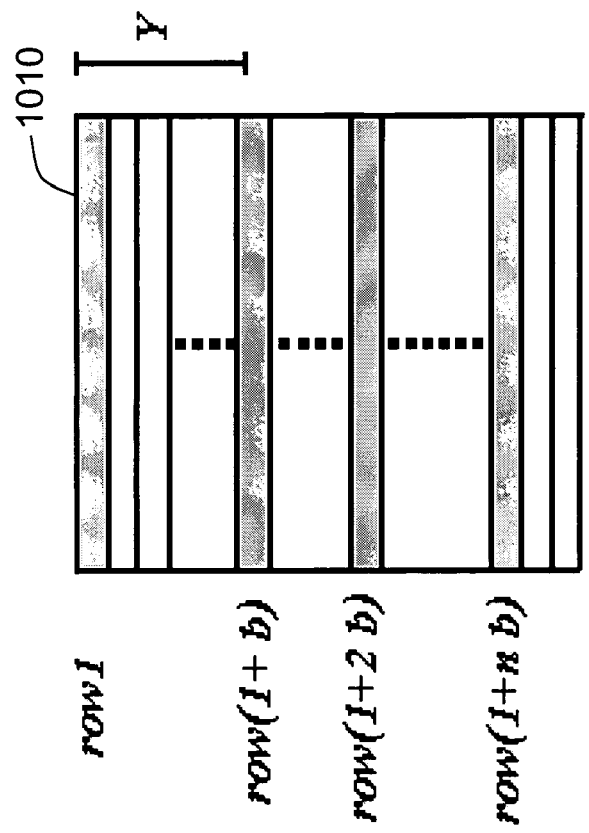
Figure 10B:
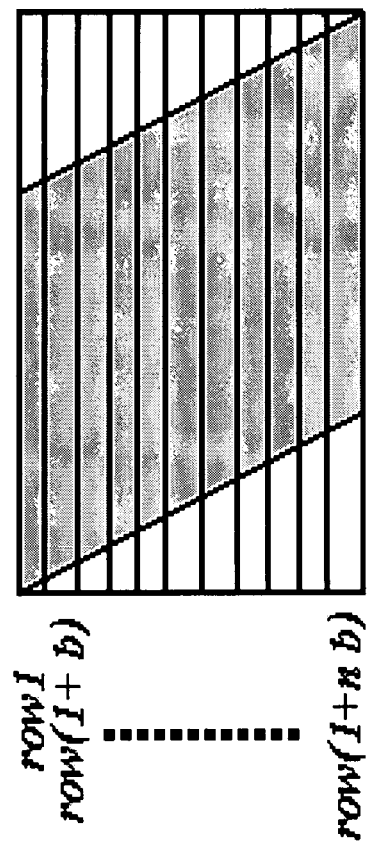

Image Data Rearrangement:

In an embodiment, the nozzle data corresponding to each swath can be taken out from the image file and integrated into an array, and the data can be rearranged according to the rotating angle of the print head. Referring to FIG. 10A, the whole content of the image file 1010 to be printed includes the first row (row 1) of the printed data corresponding to a swath in the image file 1010, the $(1+b)^{th}$ row (row 1+b), the $(1+2b)^{th}$ row (row 1+2b), the $(1+3b)^{th}$ row (row 1+3b) ... the $(1+nb)^{th}$ row (row 1+nb). In the present embodiment, the data of row 1, row 1+b, row 1+2b, row 1+3b ... row 1+nb can be taken out, as the swath print data in FIG. 10B. Then the data is rearranged according to the rotating angle of the print head. As shown in FIG. 10C, the print data is rearranged as row 1, row 1+b, row 1+2b, row 1+3b ... row 1+nb according to the rotating angle of the print head.

Figure 11A:
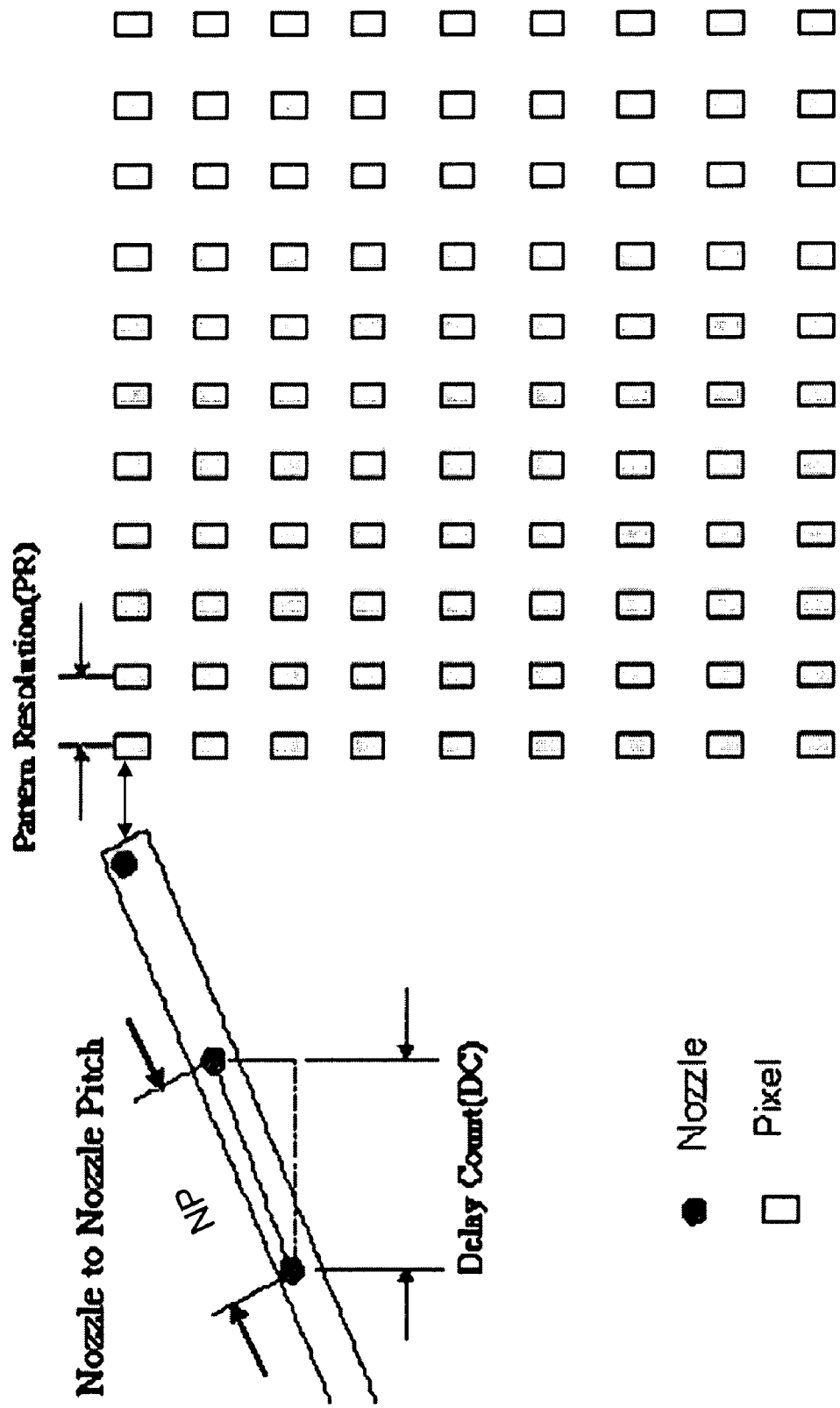
Figure 11B:
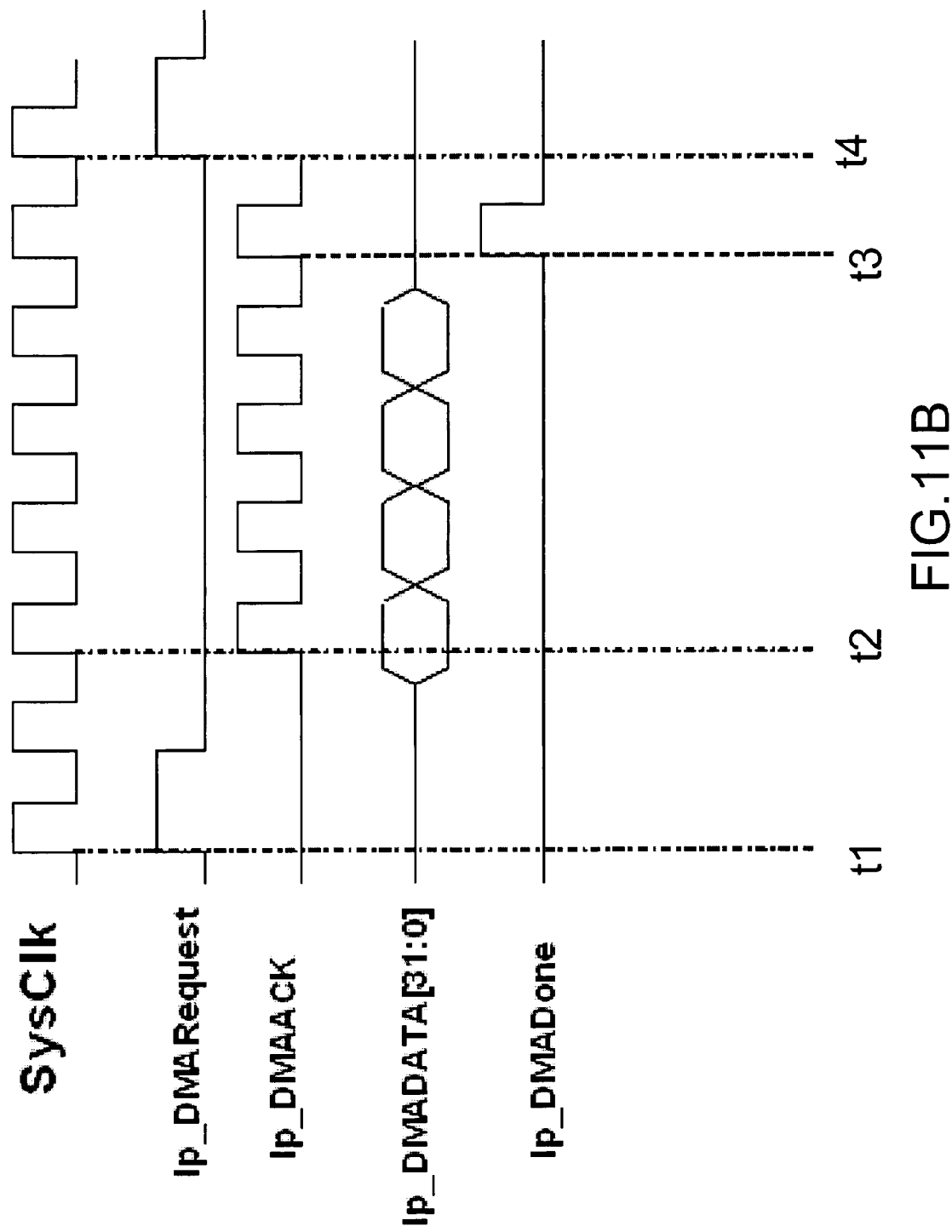

Inkjet Printing Driving:

The print head enters a printing area after being rotated an angle, the corresponding driving timing diagram is as illustrated in FIGS. 11A and 11B. In FIG. 11A, for the convenience of description, the distance between two adjacent nozzles of the print head is referred to as NP (Nozzle to Nozzle Pitch), and the spacing of each pixel of the image file is referred to as PR (pattern resolution). The encoder count different of the nozzle of each print head caused by angle rotation is referred to as DC (Pattern Delay Count). The count of the distance from the first nozzle to the first printing position is referred to as RC. XE is trigger density count.

In FIG. 11B, SysClk is a system operation clock signal, and signal lp_DMARequest is the request signal triggering direct memory access ("DMA"), such as time t1 in FIG. 11B. Signal lp_DMAACK is the confirmation signal sent by the memory when the memory received the DMA request signal, such as time t2 in FIG. 11B. The lp_DMADATA[31:0] represents the data content transmitted by the memory. After the transmission of data is completed, a signal lp_DMADone is sent to stop the transmission, such as time t3, and then next DMA is entered, such as time t4.

Figure 11C:
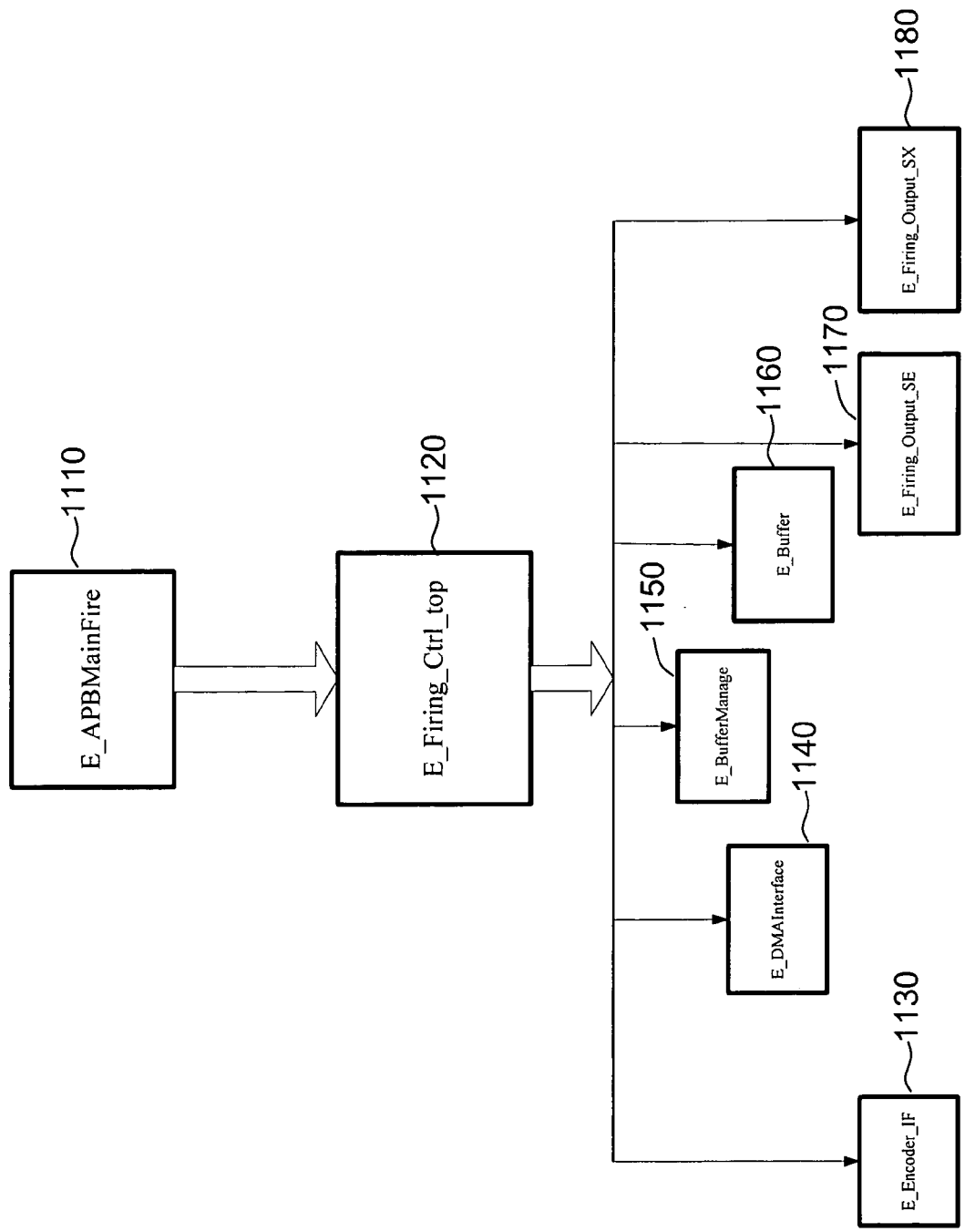

As shown in FIG. 11C, the print head driving module includes an upper level E_APBMainFire device 1110 used for receiving the printing parameters sent by the firmware. The E_Firing_Ctrl_top device 1120 is used for controlling other devices. While the controlled devices include an E_Encoder_IF device 1130, an E_DMAInterface device 1140, an E_BufferManager device 1150, an E_Buffer device 1160, an E_Firing_Output_SE device 1170, and an E_Firing_Output_SX device 1180. The E_Encoder_IF device 1130 is used for generating encoder pulse. The E_DMAInterface device 1140 transmits image data to the E_Buffer device 1160 from the memory. The E_BufferManager device 1150 controls the read/write of the data in the register of the E_Buffer device 1160. In addition, the E_Firing_Output_SE device 1170 and the E_Firing_Output_SX device 1180 transmit image data from the register of the E_Buffer device 1160 and firing pulse to the driving circuit of the print head for printing driving.

With reference to the embodiments of the present invention described above about print head rotation and swath data image division etc, how to adjust the nozzles of the print head and where and when to trigger printing in different situations, as mentioned in FIGS. 7A and 7B, will be explained here.

In the first situation as shown in FIG. 7A, that is, after the angle of the print head is adjusted, ESC DC#E (i.e. the encoder count difference caused by angle rotation of the print head) is smaller than or equal to ESC PR#E (i.e. the resolution), and the remainder R of ESC PR#E divided by ESC DC#E is 0. The data in the swath image row corresponding to the $m^{th}$ pixel is printed through firing control if the distance between the data and the $n^{th}$ nozzle (nozzle n) corresponding to the data before printing is started satisfies the following equation:

Pixel Position $(n,m)$=ESC RC#E+$(n-1)$×ESC DC#E+ $(m-1)$×ESC PR#E

Or, in consideration of trigger density count, the equation has to be divided by the trigger density count ESC #X, so that the equation becomes Pixel Position $(n,m)$=(ESC RC#E+$(n-1)$*ESC DC#E+ $(m-1)$*ESC PR#E)/ESC#X Referring to the table in FIG. 12, ESC DC#E, i.e. pattern delay count, is the encoder count difference caused by angle rotation of the print head, which must be the multiple of frequency divider count (trigger density count ESC#X) and has value 1 in the table. ESC PR#E is pattern resolution count, that is, the spacing of each pixel when setting the image file, which has value 10 in the table, and here the frequency divider count (trigger density count ESC#X) is set to 1, then the quotient of ESC PR#E divided by ESC DC#E is 10 in the table, and the remainder R is 0.

Here, the firing sequence is as following:
The first firing is 1, 11, 21, 31, 41 . . . (<=128);
The next firing is 2, 12, 22, 32, 42 . . . (<=128);
The next firing is 3, 13, 23, 33, 43 . . . (<=128);
The next firing is 4, 14, 24, 34, 44 . . . (<=128);
The next firing is 5, 15, 25, 35, 45 . . . (<=128);
The next firing is 6, 16, 26, 36, 46 . . . (<=128);
The next firing is 7, 17, 27, 37, 47 . . . (<=128);
The next firing is 8, 18, 28, 38, 48 . . . (<=128);
The next firing is 9, 19, 29, 39, 49 . . . (<=128);
The next firing is 10, 20, 30, 40, 50 . . . (<=128);
And it goes back to 1, 11, 21, 31, 41 . . . (<=128).

The third situation as shown in FIG. 7B, that is, after the angle of the print head is adjusted, ESC PR#E (i.e. the resolution) is smaller than or equal to ESC DC#E (i.e. the encoder count difference caused by the rotation of the angle of the print head) and the remainder R of ESC DC#E divided by ESC PR#E is 0. The data in the swath image row corresponding to the $m^{th}$ pixel is printed through firing control if the distance between the data and the $n^{th}$ nozzle (nozzle n) before the printing is started satisfies the following equation:

Pixel Position $(n,m)$=ESC RC#E+$(n-1)$×ESC DC#E+ $(m-1)$×ESC PR#E

But actually in consideration of frequency divider count (trigger density count ESC #X), the count of the equation has to be divided by ESC#X to become:

Pixel Position $(n,m)$=(ESC RC#E+$(n-1)$×ESC DC#E+ $(m-1)$×ESC PR#E)/ESC X#E

According to the present invention, the printing resolution is changed and different image file formats are supported by rotating the print head, and with high speed transmission, the rearranged print data is stored into the memory so as to achieve synchronous firing and avoid defects caused by delayed printing.

The pattern printing system and method in the present invention include a pattern recognition module, a printing track calculation module, a print data transmission module, a print data memory writing module, and a print head driving module. When the image file of the circuit layout pattern designed for a PCB is sent to the pattern printing system, the image file is converted by the pattern recognition module so as to be optimized. In addition, the printable data format converted by the converting procedure of the present invention is integrated with the process parameters of the pattern printing system so as to accomplish the process of the optimized algorithm.

The printing track calculation module calculates the rotating angle of the print head according to the parameters required by the pattern on the fly such as resolution or droplet size etc along with the position of the print head and the disposition of the nozzles thereof. After calculating the rotating angle of the print head and the droplet control, the print data transmission module transmits the data to be printed and the commands corresponding to the data. After that, the print data memory writing module programs the memory addresses of the received print data and the commands corresponding to the data. In an embodiment, the nozzle data corresponding to every swath is taken out from the image file and is integrated into an array, and the data is rearranged according to the rotating angle of the print head. Next, the rearranged print data is driven by the print head driving module, so that the nozzles of the print head perform printing operation according to the corresponding driving timing when the nozzles enter the printing area.

The data flow and printing method of the present invention include the following factors, wherein during the image data conversion procedure, the image data is converted into raster data, that is, raster data in a matrix. While during the printing rotation modulating and print parameter adjusting procedure, the print head is rotated, the appointed driving nozzles are selected, the print parameter variations caused by difference in the substrate characteristics are corrected, and the waveform of the print driving is set up. Regarding the arrangement of the image data, the image data is copied as an array so as to form a complete image data. Then the image data is divided and rearranged in the direction of printing. After the division, the print data memory writing module saves the swath data of the image file into a memory after rearranging the data.

The characteristic of the memory data rearrangement procedure is that the memory data is arranged in the horizontal timing sequence of the printing movement according to the selected nozzle data and the converted swath data, the memory data is a m*N memory swath, wherein N is the number of selected nozzle data, m is memory data arranged in the horizontal timing sequence of the printing movement, and having the number of triggering signals (generally the differential signals of an optical linear scale) or the multiple thereof. In particular, the data printed by the foregoing m*N matrix data presents a parallelogram data structure because of the rotating angle of the print head, and the parallelogram data is related to the number of selected nozzles and trigger signals.

In the command interpreting and transmitting procedure, the transmission command and transmission procedure are defined. After that, the rearrangement of the memory data is to rearrange the foregoing image data and save it into the memory. Next, the printing is triggered synchronously and the print waiting procedure is entered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pattern printing system, for forming structures on a non-absorbing substrate, the system comprising:

a pattern recognition module, converting an image file into image array data, and correcting the image array data according to a spreading factor of an ink relative to a substrate and process parameters based on characteristics of surface hydrophilicity/hydrophobicity of the substrate and different pattern adjustment parameters comprising solution trait of the ink, substrate surface treatment, and printing resolution, wherein the ink is employed for printing the image file on the substrate, and the spreading factor represents a flow condition of a drop of the ink provided on the substrate, wherein the spreading factor is a change in an area of points of fall on the surface of the substrate created after ink landing to the substrate;

a data calculation module, calculating a rotating angle of a print head module according to the image array data and a position of the print head module and a disposition of a plurality of nozzles of the pattern printing system to perform swath printing;

a print data memory writing module, writing swath data of the image file into a memory after rearranging the swath data; and a print head driving module, used for driving print heads and nozzles of the pattern printing system in a printing area according to rearranged print data so as to print an image corresponding to the image file.

2. The pattern printing system as claimed in claim 1 further comprising a print data transmission module used for transmitting the print data through a bus.

3. The pattern printing system as claimed in claim 1, wherein the image file to be printed is a Gerber format image file, and the image array data converted from the image file is a raster data of raster-based data format.

4. The pattern printing system as claimed in claim 3, wherein calculating the rotating angle of the print head according to the position of the print head module and the disposition of the nozzles includes considering the resolution parameter of the raster data, a spacing parameter between adjacent nozzles after rotating the print head module, and a count of distance from a first nozzle to a first position to be printed.

5. The pattern printing system as claimed in claim 4, wherein a trigger density count parameter is further considered.

6. The pattern printing system as claimed in claim 4, wherein calculating the rotating angle of the print head according to the position of the print head module and the disposition of the nozzles includes considering:

while the space parameter between adjacent nozzles being smaller than or equal to the resolution parameter of the raster data, and a remainder of the resolution parameter of the raster data being divided by the space parameter between adjacent nozzles being 0, while the space parameter between adjacent nozzles being smaller than or equal to the resolution parameter of the raster data and the remainder of the resolution parameter of the raster data being divided by the space parameter between adjacent nozzles being not 0, while the space parameter between adjacent nozzles being greater than the resolution parameter of the raster data, and the remainder of the resolution parameter of the raster data being divided by the space parameter between adjacent nozzles being 0, while the space parameter between adjacent nozzles being greater than the resolution parameter of the raster data, and the remainder of the resolution parameter of the raster data being divided by the space parameter between adjacent nozzles being not 0, respectively generating different rotating angles of the print head module.

7. The pattern printing system as claimed in claim 6, wherein while the space parameter between adjacent nozzles is smaller than or equal to the resolution parameter of the raster data and the remainder of the resolution parameter of the raster data being divided by the space parameter between adjacent nozzles is 0, the data in a swath image row corresponding to a $m^{th}$ pixel is printed through firing control if the distance between the data and a corresponding $n^{th}$ nozzle before printing is started satisfies the following equation:

Pixel position $(n,m)$=the count of the distance from the first nozzle to the first position to be printed+$(n-1)\times$spacing distance between adjacent nozzles after rotating the print head module+$(m-1)\times$resolution parameter of the raster data.

8. The pattern printing system as claimed in claim 6, wherein while the spacing between the two adjacent nozzles is smaller than or equal to the resolution parameter of the raster data, and the remainder of the resolution parameter of the raster data divided by the spacing parameter between two adjacent nozzles is 0, the data in the swath image row corresponding to the $m^{th}$ pixel is printed through firing control if with the trigger density count parameter taken into consideration, the distance between the data and the corresponding $n^{th}$ nozzle before printing is started satisfies the following equation:

Pixel position $(n,m)$=(the count of the distance from the first nozzle to the first position to be printed+$(n-1)\times$spacing distance between adjacent nozzles after rotating the print head module+$(m-1)\times$resolution parameter of the raster data)/trigger density count parameter.

9. The pattern printing system as claimed in claim 1, wherein calculating the rotating angle of the print head module according to the position of the print head module and the disposition of the nozzles thereof includes considering a number of print heads and a number of nozzles in the print head module.

10. The pattern printing system as claimed in claim 1, wherein performing swath printing includes dividing the image file into a plurality of swaths, and printing the swaths in a swath by swath pattern.

11. The pattern printing system as claimed in claim 1, wherein performing swath printing includes dividing the image file into a plurality of swaths, and printing the swaths in an interlace patterning manner.

12. The pattern printing system as claimed in claim 1, wherein the data corresponding to each swath in the image file is taken out from the image file and integrated into an array, and then the array data is rearranged according to the rotating angle of the print head module.

13. The pattern printing systems as claimed in claim 1, wherein if the number of nozzles is m, and the image filed is divided into n swaths, the characteristic of the method of rearranging the swath data of the image file by the print data memory writing module is that, every time the 1st, (n+1)th . . . (mn+1)th row of the image data is transmitted, and in total m rows of image data are combined into a content of a first memory swath to be printed sequentially, next time an image data of the 2nd, (n+2)th, (2n+2)th . . . (mn+2)th row is transmitted, and in total m rows of image data are combined into the content of the second memory swath to be printed sequentially.

14. The pattern printing system as claimed in claim 1, wherein a characteristic of the print data memory writing module rearranging the swath data of the image file and saving the swath data into the memory is that the spacing between the nozzles is calculated according to different inputted rotating angles of the print head and the print data parallel to a printing direction is level shifted.

15. A data processing method for pattern printing to form structures on a surface of a non-absorbing substrate, the method, comprising:

performing an image data conversion procedure, converting an image data into an array of raster data;

performing a print head rotating modulation and printing parameter adjustment procedure, rotating a print head, selecting one or multiple driven nozzles, correcting variations of print head parameters caused by differences in characteristics of a substrate according to a spreading factor of an ink relative to the substrate and different pattern adjustment parameters comprising solution trait of the ink, substrate surface treatment, and printing resolution, and setting a driving waveform of the print head, wherein the ink is employed for printing a image file on the substrate, and the spreading factor represents a flow condition of a drop of the ink provided on the substrate, wherein the spreading factor is a change in an area of points of fall on the surface of the substrate created after ink landing to the substrate;

performing an image data arrangement procedure, copying the data image into an array to form an image data;

performing an image data dividing and rearranging procedure in a printing direction, after dividing the image data, saving a print data into a memory module, saving swath data of the image file into a memory after rearranging the swath data;

performing a command interpreting and transmitting procedure, defining a command transmitting instruction and a transmission path;

performing a memory data rearrangement procedure, saving rearranged image data into the memory; and after the performances mentioned above, entering a synchronous triggering printing procedure, used for receiving a trigger signal and then starting printing.

16. The data processing method as claimed in claim 15, wherein a characteristic of memory data rearrangement procedure is that the memory data is arranged in a horizontal timing sequence of a printing movement according to selected nozzle data and converted swath data, the memory data is a m*N memory swath, wherein N is a number of selected nozzle data, m is memory data arranged in the horizontal timing sequence of the printing movement, and having a number of triggering signals or a multiple thereof.

17. The data processing method as claimed in claim 15, wherein calculating a rotating angle of the print head according to a position of a print head module and a disposition of the nozzles regarding a print head rotating modulation includes considering the resolution parameter of the raster data, a spacing parameter between adjacent nozzles after rotating the print head module, and a count of a distance from a first nozzle to a first position to be printed.

18. The data processing method as claimed in claim 15, wherein regarding the print head rotation modulation, calculating the rotating angle of the print head module according to the position of the print head module and the disposition of the nozzles includes considering:

while the spacing between the adjacent nozzles being smaller than or equal to the resolution parameter of the raster data, and a remainder of the resolution parameter of the raster data divided by the spacing between the adjacent nozzles being 0, while the spacing between the adjacent nozzles being smaller than or equal to the resolution parameter of the raster data, and the remainder of the resolution parameter of the raster data divided by the spacing between the adjacent nozzles being not 0, while the spacing between the adjacent nozzles being greater than the resolution parameter of the raster data, and the remainder of the resolution parameter of the raster data divided by the spacing between the adjacent nozzles being 0, while the spacing between the adjacent nozzles being greater than the resolution parameter of the raster data, and the remainder of the resolution parameter of the raster data divided by the spacing between the adjacent nozzles being not 0, respectively creating different rotating angles of the print head module.

19. The data processing method as claimed in claim 15, wherein while the spacing between the adjacent nozzles is smaller than or equal to the resolution parameter of the raster data, and the remainder of the resolution parameter of the raster data divided by the spacing between the adjacent nozzles is 0, the data in a swath image row corresponding to a $m^{th}$ pixel is printed through firing control if the distance between the data and a corresponding $n^{th}$ nozzle before printing is started satisfies the following equation:

Pixel position $(n,m)$=the count of the distance from the first nozzle to the first position to be printed+$(n-1)$×spacing distance between adjacent nozzles after rotating the print head module+$(m-1)$×resolution parameter of the raster data.

20. The data processing method as claimed in claim 15, wherein regarding the image data, while the spacing between the adjacent nozzles is smaller than or equal to the resolution parameter of the raster data, and the remainder of the resolution parameter of the raster data divided by the spacing between the adjacent nozzles is 0, the data in the swath image row corresponding to the $m^{th}$ pixel is printed through firing control if with a trigger density count parameter taken into consideration, the distance between the data and the corresponding $n^{th}$ nozzle before printing is started satisfies the following equation:

Pixel position $(n,m)$=(the count of the distance from the first nozzle to the first position to be printed+$(n-1)$×spacing distance between adjacent nozzles after rotating the print head module+$(m-1)$×resolution parameter of the raster data)/trigger density count parameter.

21. The data processing method as claimed in claim 15, wherein calculating the rotating angle of the print head module according to the position of the print head module and the disposition of the nozzles thereof includes considering a number of print heads and a number of nozzles in the print head module.

22. The data processing method as claimed in claim 15, wherein performing swath printing includes dividing the image file into a plurality of swaths, and printing the swaths in a swath by swath pattern.

23. The data processing method as claimed in claim 15, wherein performing swath printing includes dividing the image file into a plurality of swaths, and printing the swaths in an interlace patterning manner.

24. The data processing method as claimed in claim 15, wherein the data corresponding to each swath in the image file is taken out from the image file and integrated into an array, and then the array data is rearranged according to the rotating angle of the print head module.

25. The data processing method as claimed in claim 15, wherein if the number of nozzles is m, and the image file is divided into n swaths, a characteristic of the method of rearranging the swath data of the image file by a print data memory writing module is that, every time the 1st, (n+1)th . . . (2n+1)th . . . (mn+1)th row of the image data is transmitted, and in total m rows of image data are combined into a content of a first memory swath to be printed sequentially, next time the image data of the 2nd, (n+2)th, (2n+2)th . . . (mn+2)th row is transmitted, and in total m rows of image data are combined into a content of the second memory swath to be printed sequentially.

26. A data processing method for pattern printing to form structures on a non-absorbing substrate, the method, comprising:
    performing an image data conversion procedure, converting an image data into an array of raster data;
    performing a print head rotating modulation and printing parameter adjustment procedure, rotating a print head, selecting one or multiple driven nozzles, correcting variations of print head parameters caused by differences in characteristics of a substrate according to a spreading factor of an ink relative to the substrate and different pattern adjustment parameters comprising solution trait of the ink, substrate surface treatment, and printing resolution, and setting a driving waveform of the print head, wherein the ink is employed for printing a image file on the substrate, and the spreading factor represents a flow condition of a drop of the ink provided on the substrate, wherein the spreading factor is a change in an area of points of fall on the surface of the substrate created after ink landing to the substrate;
    performing an image data dividing and rearranging procedure in a printing direction, after dividing the image data, saving a print data into a memory module, saving swath data of the image file into a memory after rearranging the swath data;
    performing a command interpreting and transmitting procedure, defining the command transmitting instruction and a transmission procedure;
    performing a memory data rearrangement procedure, saving the rearranged image data into the memory; and
    after the performances mentioned above, entering a synchronous triggering printing procedure, used for receiving a trigger signal and then starting printing.

27. The data processing method as claimed in claim 26 wherein a characteristic of a memory data rearrangement procedure is that the memory data is arranged in a horizontal timing sequence of a printing movement according to selected nozzle data and converted swath data, the memory data is a m*N memory swath, wherein N is a number of selected nozzle data, m is memory data arranged on the horizontal timing sequence of the printing movement, and having a number of triggering signals or a multiple thereof; the data printed by the foregoing m*N matrix data presents a parallelogram data structure because of the rotating angle of the print head, and the parallelogram data is related to the number of selected nozzles and trigger signals.

28. The data processing method as claimed in claim 26, wherein calculating the rotating angle of the print head according to a position of the print head module and a disposition of the nozzles regarding a print head rotating modulation includes considering the resolution parameter of the raster data, the spacing parameter between adjacent nozzles after rotating the print head module, and a count of distance from a first nozzle to a first position to be printed.

29. The data processing method as claimed in claim 26, wherein regarding the print head rotation modulation, calculating the rotating angle of the print head module according to the position of the print head module and the disposition of the nozzles includes considering:
    while the spacing between the adjacent nozzles being smaller than or equal to the resolution parameter of the raster data, and a remainder of the resolution parameter of the raster data divided by the spacing between the adjacent nozzles being 0,
    while the spacing between the adjacent nozzles being smaller than or equal to the resolution parameter of the raster data, and the remainder of the resolution parameter of the raster data divided by the spacing between the adjacent nozzles being not 0,
    while the spacing between the adjacent nozzles being greater than the resolution parameter of the raster data, and the remainder of the resolution parameter of the raster data divided by the spacing between the adjacent nozzles being 0,
    while the spacing between the adjacent nozzles being greater than the resolution parameter of the raster data, and the remainder of the resolution parameter of the raster data divided by the spacing between the adjacent nozzles being not 0,
    respectively creating different rotating angles of the print head module.

30. The data processing method as claimed in claim 26, wherein while the spacing between the adjacent nozzles is smaller than or equal to the resolution parameter of the raster data, and the remainder of the resolution parameter of the raster data divided by the spacing between the adjacent nozzles is 0, the data in the swath image row corresponding to the $m^{th}$ pixel is printed through firing control if the distance between the data and the corresponding $n^{th}$ nozzle before printing is started satisfies the following equation:

$$\text{Pixel position } (n,m) = \text{the count of the distance from the first nozzle to the first position to be printed} + (n-1) \times \text{spacing distance between adjacent nozzles after rotating the print head module} + (m-1) \times \text{resolution parameter of the raster data.}$$

31. The data processing method as claimed in claim 26, wherein while the spacing between the adjacent nozzles is smaller than or equal to the resolution parameter of the raster data, and the remainder of the resolution parameter of the raster data divided by the spacing between the adjacent nozzles is 0, the data in the swath image row corresponding to the $m^{th}$ pixel is printed through firing control if with a trigger density count parameter taken into consideration, the distance between the data and the corresponding $n^{th}$ nozzle before printing is started satisfies the following equation:

$$\text{Pixel position } (n,m) = (\text{the count of the distance from the first nozzle to the first position to be printed} + (n-1) \times \text{spacing distance between adjacent nozzles after rotating the print head module} + (m-1) \times \text{resolution parameter of the raster data}) / \text{trigger density count parameter.}$$

32. The data processing method as claimed in claim 26, wherein calculating the rotating angle of the print head module according to the position of the print head module and the disposition of the nozzles thereof includes considering a number of print heads and a number of nozzles in the print head module.

33. The data processing method as claimed in claim 26, wherein performing swath printing includes dividing the image file into a plurality of swaths, and printing the swaths in a swath by swath pattern.

34. The data processing method as claimed in claim 26, wherein performing swath printing includes dividing the image file into a plurality of swaths, and printing the swaths in an interlace patterning manner.

35. The data processing method as claimed in claim 26, wherein the data corresponding to each swath in the image file is taken out from the image file and integrated into an array, and then the array data is rearranged according to the rotating angle of the print head module.

36. The data processing method as claimed in claim 26, wherein if the number of nozzles is m, and the image file is divided into n swaths, the characteristic of the method of rearranging the swath data of the image file by a print data memory writing module is that, every time the 1st, (n+1)th . . . (2n+1)th . . . (mn+1)th row of the image data is transmitted, and in total m rows of image data are combined into a content of a first memory swath to be printed sequentially, next time the image data of the 2nd, (n+2)th, (2n+2)th . . . (mn+2)th row is transmitted, and in total m rows of image data are combined into a content of a second memory swath to be printed sequentially.

37. The data processing method as claimed in claim 26, wherein a characteristic of the print data memory writing module rearranging the swath data of the image file and saving the swath data into the memory is that the spacing between the nozzles is calculated according to different inputted rotating angles of the print head and the print data parallel to the printing direction is level shifted.

* * * * *